(12) United States Patent
Omata et al.

(10) Patent No.: US 9,772,095 B2
(45) Date of Patent: Sep. 26, 2017

(54) ORGANIC ELECTROLUMINESCENCE MODULE, SMART DEVICE, AND LIGHTING DEVICE

(71) Applicant: Konica Minolta, Inc., Tokyo (JP)

(72) Inventors: Kazuyoshi Omata, Akishima (JP); Tsukasa Yagi, Kobe (JP); Kuniaki Shida, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/913,813

(22) PCT Filed: Sep. 18, 2014

(86) PCT No.: PCT/JP2014/074697
§ 371 (c)(1),
(2) Date: Feb. 23, 2016

(87) PCT Pub. No.: WO2015/182001
PCT Pub. Date: Dec. 3, 2015

(65) Prior Publication Data
US 2016/0363304 A1    Dec. 15, 2016

(30) Foreign Application Priority Data

May 30, 2014    (JP) .................................. 2014-112333

(51) Int. Cl.
*F21V 23/04* (2006.01)
*G06F 3/044* (2006.01)
(Continued)

(52) U.S. Cl.
CPC ............ *F21V 23/0485* (2013.01); *G06F 1/00* (2013.01); *G06F 3/044* (2013.01); *G06F 3/0412* (2013.01);
(Continued)

(58) Field of Classification Search
CPC ............ H01L 51/5012; H01L 51/0096; H01L 51/5246; H01L 51/5072; H01L 51/5088;
(Continued)

(56) References Cited

U.S. PATENT DOCUMENTS 9,425,439 B2 *  8/2016  Yamamoto .............. H01L 51/56
2008/0036746 A1  2/2008  Klinghult
(Continued)

FOREIGN PATENT DOCUMENTS

CN       100442213 C    12/2008
JP       2007534070 A   11/2007
(Continued)

OTHER PUBLICATIONS

International Search Report dated Nov. 11, 2014 for Application No. PCT/JP2014/074697 and English translation.
(Continued)

*Primary Examiner* — Haissa Philogene
(74) *Attorney, Agent, or Firm* — Lucas & Mercanti, LLP

(57) ABSTRACT

An object of the present invention is to provide an organic EL device that includes an electrode having a light-emitting function and a touch sensing function, an organic electroluminescent module that includes a specific controlling circuit and can contribute to reduction in sizes and thickness and simplified production steps of the device, and a smart device and an illumination device each including the organic electroluminescent module. The organic electroluminescent module of the present invention has a touch sensing function and includes a capacitive touch sensing circuit unit and a light-emitting device driving circuit unit including a light-emitting device driving circuit section for driving an organic electroluminescent panel. The organic electroluminescent panel includes paired opposite plate electrodes therein. The paired electrodes are connected to the light-emitting device (Continued)

driving circuit unit, and one of the paired electrodes is a touch sensing electrode that is connected to the touch sensing circuit unit.

11 Claims, 24 Drawing Sheets

(51) Int. Cl.
  *H01L 51/50* (2006.01)
  *H01L 27/32* (2006.01)
  *H05B 33/08* (2006.01)
  *G06F 1/00* (2006.01)
  *G06F 3/041* (2006.01)
  *F21Y 115/20* (2016.01)

(52) U.S. Cl.
  CPC ......... *G06F 3/0416* (2013.01); *H01L 27/323* (2013.01); *H01L 51/50* (2013.01); *H05B 33/08* (2013.01); *H05B 33/0896* (2013.01); *F21Y 2115/20* (2016.08); *G06F 2203/04103* (2013.01); *H01L 2251/5338* (2013.01)

(58) Field of Classification Search
  CPC ............ H01L 51/5056; H01L 51/5092; H01L 27/323; H01L 51/50; H01L 51/5203; H01L 51/5206; H01L 51/5221; H05B 33/08; H05B 33/0818; H05B 33/0896; H05B 37/0227; H05B 37/0245; F21V 23/0485; F21Y 2115/20; G06F 3/041; G06F 3/044

USPC .... 315/169.1, 169.3, 291; 345/76, 173, 175, 345/207, 690
  See application file for complete search history.

(56) References Cited

U.S. PATENT DOCUMENTS

| | | | |
|---|---|---|---|
| 2014/0204041 A1* | 7/2014 | Munechika | ........... G06F 3/0416 345/173 |
| 2017/0123541 A1* | 5/2017 | Omata | ................ G09G 3/3208 |

FOREIGN PATENT DOCUMENTS

| | | |
|---|---|---|
| JP | 2011514700 A | 5/2011 |
| JP | 2012502421 A | 1/2012 |
| JP | 2012504811 A | 2/2012 |
| JP | 2012194291 A | 10/2012 |
| JP | 2013065429 A | 4/2013 |
| KR | 10-2007-0011524 A | 1/2007 |
| WO | 2010032329 A1 | 3/2010 |

OTHER PUBLICATIONS

Office Action dated Sep. 26, 2016 from corresponding Chinese Application; Application No. 201480047722.0; Text portion of English translation of the Office Action; Total of 11 pages.
IPRP dated Dec. 6, 2016 for PCT/JP2014/074697.
Office Action dated Jun. 21, 2017 from corresponding Korean Patent Application No. KR 10-2016-7004840 and English translation; Total of 7 pages.

* cited by examiner

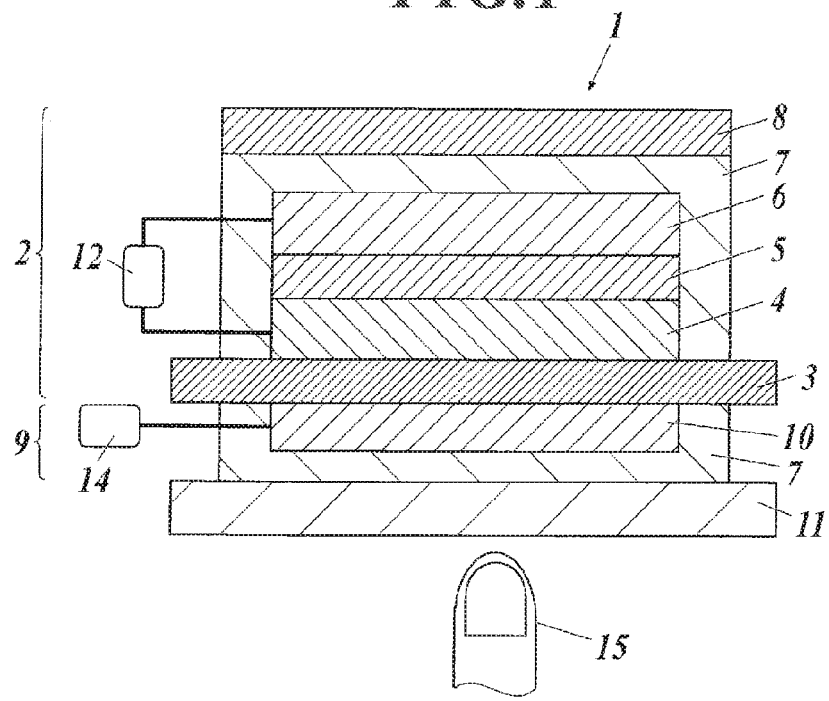
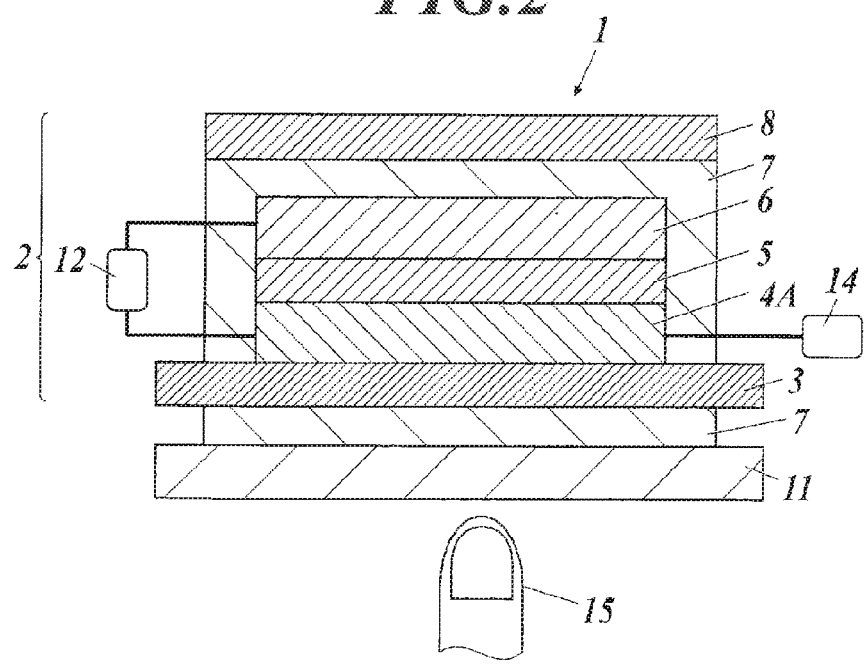

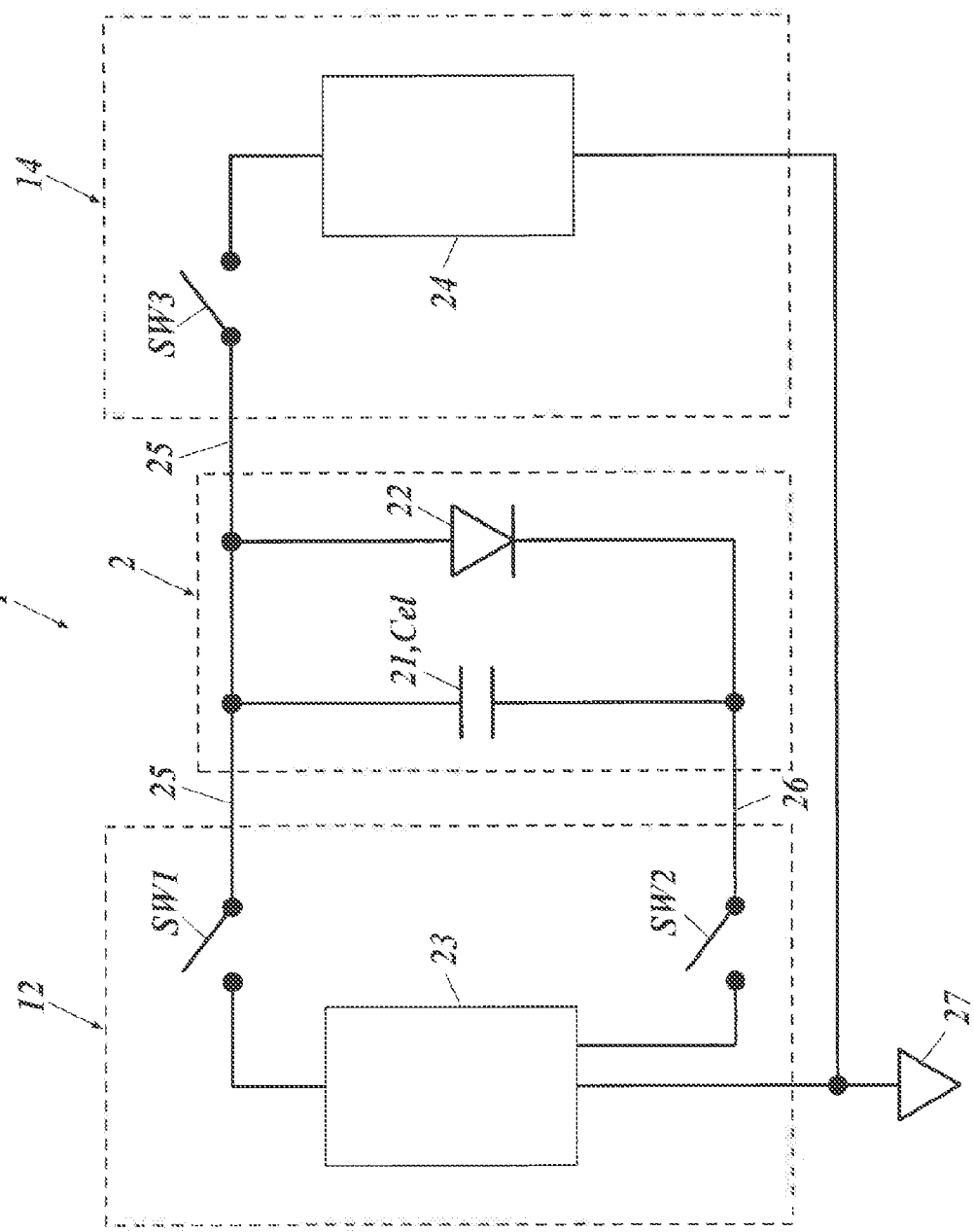

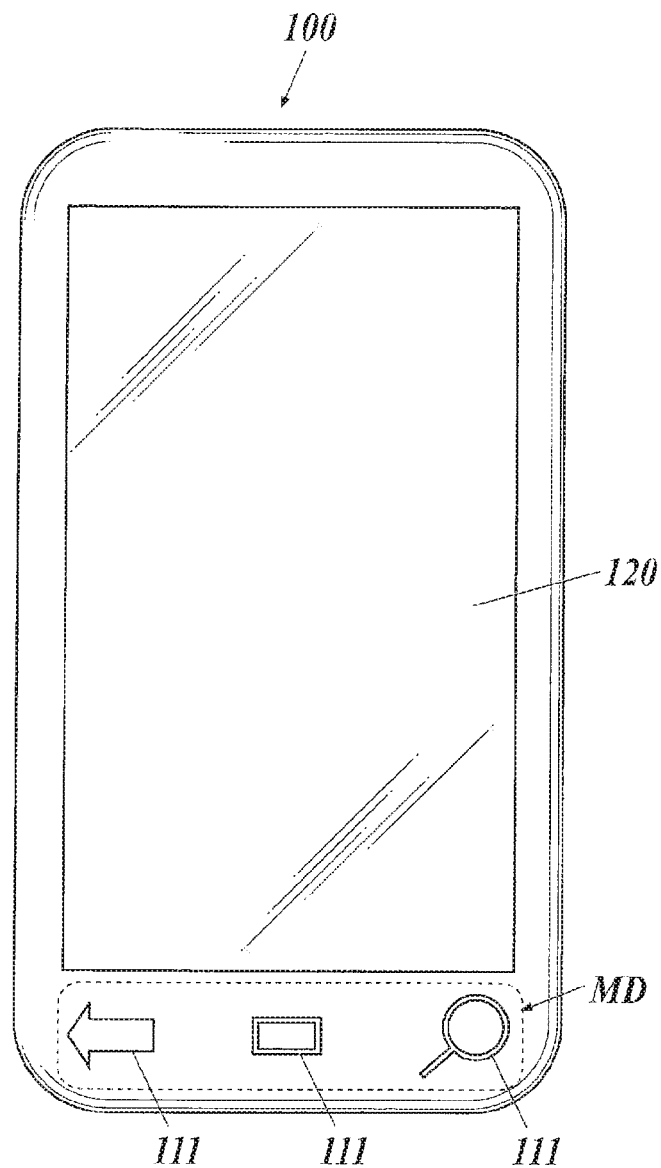

ORGANIC ELECTROLUMINESCENCE MODULE, SMART DEVICE, AND LIGHTING DEVICE

CROSS REFERENCE TO RELATED APPLICATION

This Application is a 371 of PCT/JP2014/074697 filed on Sep. 18, 2014, which, in turn, claimed the priority of Japanese Patent Application No. JP2014-112333 filed on May 30, 2014, both applications are incorporated herein by reference.

TECHNICAL FIELD

The present invention relates an organic electroluminescent module having a touch sensing function, and a smart device and an illumination device provided with the module.

BACKGROUND ART

Examples of traditional flat light sources include light emitting diodes (LEDs) provided with light guiding plates, and organic light emitting diodes (OLEDs) or organic electroluminescent devices (OLEDs).

Smart devices, such as smart phones and tablets, have gotten exponential increased sales on a world scale from around 2008. These smart devices are provided with a keyboard having a flat face in view of user-friendliness. For example, the keyboard corresponds to the icon region including common functional key buttons provided at the bottom of a smart device. One example combination of the common functional key buttons consists, for example, of "Home" (indicated by a square mark), "Return" (indicated by an arrow mark), and "Search" (indicated by a loupe mark).

In order to improve the visibility of these common functional key buttons, for example, LEDs are disposed together with a flat emission device, such as an LED light guiding plate, in tune with the pattern of the mark to be displayed in the interior of the smart device, as is disclosed, for example, Patent Literature 1.

A capacitance-type information input unit with an LED light source is also disclosed. This input unit includes a flexible printed circuit (FPC) having a highly sensitive sensor electrode that can certainly detect a variation in electrostatic capacitance and stabilize the input operation by a user, and an adhesive layer having a dielectric constant higher than that of an air layer having the same shape and disposed at positions other than the icon regions between the circuit and a surface panel (refer to, for example, Patent Literature 2).

Besides the LED light sources, use of surface emitting organic electroluminescent devices has come into action for display of icon regions for the purpose of a reduction of electric power consumption and more uniform light emission brilliance in recent years. To achieve display functions, these organic electroluminescent devices are provided on the rear sides of cover glasses, while icon marks have been preliminarily printed on the front sides of the cover glasses.

Smart devices inevitably require touch functions for use, and capacitive touch sensing devices for from display portions to common functional keys are usually disposed on the rear sides of the cover glasses.

A typical touch sensing device includes a film/film-type touch sensor that is enlarged to the size of a cover glass and is laminated to the cover glass. For devices that can have any thickness, a touch sensor of a glass/glass type is also used in some cases. An electrostatic capacitance scheme has been applied to touch detection in many cases in recent years. "Projective capacitive touch sensors", which have fine electrode patterns along the x and y axes, have been used in main displays. In this scheme, two or more points can be touch-detected (so called "multi-touch").

Since such a touch sensor is used, a light emitting device having no touch function has been used at a common functional key portion. Displays of an "in-cell" or "on-cell" type placed on the market, however, have highly demanded light emitting devices having dedicated touch sensing functions for common functional keys.

In a surface emission organic electroluminescent device, an anode, a cathode, or a metal foil protective layer adversely affects the detection of the capacitance in the surface capacitive scheme; hence, for an organic electroluminescent device having electrostatic touch functions, an independent touch sensing electrode as an assembly should be provided for detecting a touch composed of an electrical connecting unit on a flexible board provided with an electrostatic detecting circuit and a wiring portion, for example, a flexible print circuit (FPC), together with an organic electroluminescent panel, adjacent to the light emitting side, as shown in FIG. 1 (described later) Such a structure inevitably has a large thickness due to increased components and thus its use is restricted. In use of such an assembly, a device for detecting the touch, such as an FPC, should be additionally prepared, resulting in several disadvantages, such as increased costs, increased thicknesses of the devices, and increased production steps.

Development of a thin compact organic electroluminescent module suitable for smart devices is highly demanded in which organic electroluminescent devices for icon regions and wiring material for controlling the drive of the devices are effectively disposed.

CITATION LIST

Patent Literature

PTL 1: Japanese Unexamined Patent Application Publication No. 2012-194291
PTL 2: Japanese Unexamined Patent Application Publication No. 2013-065429

SUMMARY OF INVENTION

Technical Problem

An object of the present invention, which has been made in view of the problems and circumstances described above, is to provide an organic electroluminescent device including an electrode having a light-emitting function and a touch sensing function, an organic electroluminescent module that includes a specific controlling circuit and can contribute to reductions in sizes and thickness and simplified production steps of the device, and a smart device and an illumination device each including the organic electroluminescent module.

Solution to Problem

After diligent examination of these problems, the inventors of the present invention have found that the problems can be solved by an organic electroluminescent module in which any one of the electrodes in an organic electroluminescent panel functions as a touch sensing electrode and a touch sensing circuit unit and a light-emitting device driving circuit unit are connected to the organic electroluminescent panel, and have arrived at the present invention.

In specific, the problems to be addressed by the present invention are solved by the following means.

1. An organic electroluminescent module having a touch sensing function, the organic electroluminescent module comprising:

a capacitive touch sensing circuit unit; and a light-emitting device driving circuit unit including a light-emitting device driving circuit section for driving an organic electroluminescent panel, wherein the organic electroluminescent panel comprises paired opposite plate electrodes therein, the paired electrodes are connected to the light-emitting device driving circuit unit, and one of the paired electrodes is a touch sensing electrode, the touch sensing electrode being connected to the touch sensing circuit unit.

2. The organic electroluminescent module according to Aspect 1, wherein the touch sensing circuit unit and the light-emitting device driving circuit unit are connected to a common ground.

3. The organic electroluminescent module according to Aspect 1 or 2, wherein the emission term of the organic electroluminescent panel controlled by the light-emitting device driving circuit section is separated from the touch sensing term of the organic electroluminescent panel controlled by the touch sensing circuit section, and at least one of the paired electrodes is in a floating potential during the touch sensing term to prevent detection of the capacitance of the organic electroluminescent panel.

4. The organic electroluminescent module according to Aspect 1 or 2, wherein the emission term of the organic electroluminescent panel controlled by the light-emitting device driving circuit section is separated from the touch sensing term of the organic electroluminescent panel controlled by the touch sensing circuit section, and both of the paired electrodes are in a floating potential during the touch sensing term to prevent detection of the capacitance of the organic electroluminescent panel.

5. The organic electroluminescent module according to Aspect 1 or 2, wherein the emission term of the organic electroluminescent panel controlled by the light-emitting device driving circuit section is separated from the touch sensing term of the organic electroluminescent panel controlled by the touch sensing circuit section, and at least one of the paired electrodes is in a floating potential and the paired electrodes are short-circuited during the touch sensing term to prevent detection of the capacitance of the organic electroluminescent panel.

6. The organic electroluminescent module according to Aspect 1 or 2, wherein the emission term of the organic electroluminescent panel controlled by the light-emitting device driving circuit section is separated from the touch sensing term of the organic electroluminescent panel controlled by the touch sensing circuit section, and both of the paired electrodes are in a floating potential during the touch sensing term and the paired electrodes are short-circuited to prevent detection of the capacitance of the organic electroluminescent panel.

7. The organic electroluminescent module according to Aspect 1 or 2, wherein, the organic electroluminescent panel controlled by the light-emitting device driving circuit section is driven to continuously emit light, while the touch sensing term periodically occurs under the control of the touch sensing circuit section.

8. The organic electroluminescent module according to any one of Aspects 1 to 7, wherein the emission term includes a reverse-voltage applying time at the end of the emission term.

9. The organic electroluminescent module according to any one of Aspects 1 to 8, wherein a capacitor is disposed between a lead connecting the light-emitting device driving circuit section with the ground and a lead connecting the touch sensing circuit section with the ground.

10. A smart device comprising an organic electroluminescent module according to any one of Aspects 1 to 9.

11. An illumination device comprising an organic electroluminescent module according to any one of Aspects 1 to 9.

Advantageous Effects of Invention

The means of the present invention described above can provide an organic electroluminescent device that includes an electrode having a light-emitting function and a touch sensing function, an organic electroluminescent module that includes a specific controlling circuit and can contribute to reductions in sizes and thickness and simplified production steps of the device, and a smart device and an illumination device each including the organic electroluminescent module.

The technical features and mechanism to provide advantageous effects of the organic electroluminescent module defined in the present invention will now be described.

A traditional organic electroluminescent module applied to an icon region of a smart medium, as described below with reference to FIG. 1, includes an organic electroluminescent panel including paired opposite electrodes and a touch sensing electrode for detecting a touch, such as a flexible printed circuit (FPC). In such a traditional organic electroluminescent module, a light-emitting function and a touch sensing function are provided by different assemblies. The traditional organic electroluminescent module having such a configuration inevitably has a large thickness, which hinders a reduction in sizes of an organic electroluminescent device.

To address the problem, an organic electroluminescent module (hereinafter simply referred to as "organic EL module") of the present invention includes an organic electroluminescent panel (hereinafter simply referred to as "organic EL panel") including a first electric controller and a second electric controller. The first electric controller is a light-emitting device driving circuit unit that is disposed between the paired opposite electrodes and is configured to control light emission. The second electric controller is a touch sensing circuit unit to cause at least one of the paired electrodes to function as a touch sensing electrode. An exemplary configuration of the organic electroluminescent module is illustrated in FIG. 2 described below.

An anode or a cathode is usually set as a touch sensing electrode (hereinafter simply referred to as "sensing electrode") in an organic EL panel or organic EL device, where Cf is a finger capacitance between the finger and the touch sensing electrode, and Cel is an interelectrode capacitance between the anode and the cathode. In this state, the capacitance between the anode and the cathode is Cf+Cel at a touch (finger touch) and is Cel at no finger touch. The interelectrode capacitance Cel is greater than the finger capacitance Cf in general organic EL panels or organic EL devices. Such relation precludes touch detection.

In the organic EL module of the present invention, the light-emitting device driving circuit unit and the touch sensing circuit unit are separately provided. In addition, at a touch detection, the switches between the anode and the cathode and the light-emitting device driving circuit section are turned off and at least one of the anode and the cathode is in a floating potential so that the interelectrode capacitance Cel between the anode and the cathode is not detected. This configuration can provide a touch sensing function and can contribute to reductions in sizes and thickness and simplified production steps of the organic electroluminescent device.

In the present invention, a component in a floating potential state is not connected to a power or a ground. Since the anode or cathode is in the floating potential at touch detection, a finger touch can be detected without detection of the interelectrode capacitance Cel of the organic EL panel.

BRIEF DESCRIPTION OF DRAWINGS

FIG. 1 is a schematic cross-sectional view of an example organic electroluminescent module in Comparative Example.

FIG. 2 is a schematic cross-sectional view of an exemplary organic electroluminescent module according to the present invention that includes an anode functioning as a sensing electrode.

FIG. 3 is a driving circuit diagram of an exemplary organic electroluminescent module according to Embodiment 1.

FIG. 25 is a schematic view of an exemplary smart device provided with an organic electroluminescent module according to the present invention.

DESCRIPTION OF EMBODIMENTS

Figure 4:
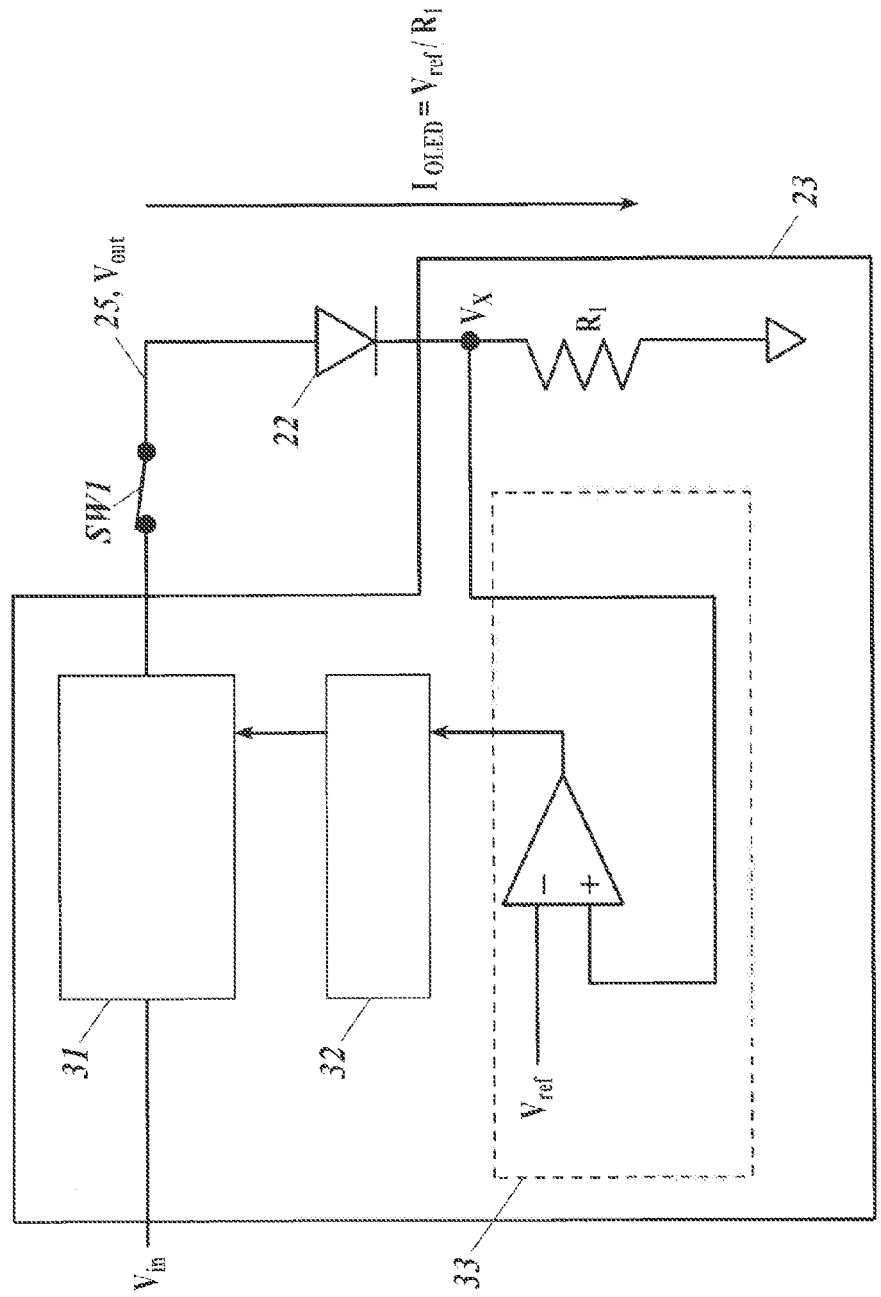
FIG. 4 is a schematic circuit diagram of an exemplary light-emitting device driving circuit unit according to the present invention.

An organic electroluminescent module according to the present invention has a touch sensing function, and includes a capacitive touch sensing circuit unit and a light-emitting device driving circuit unit including a light-emitting device driving circuit section for driving an organic electroluminescent panel. The organic electroluminescent panel includes paired opposite plate electrodes therein. The paired electrodes are connected to the light-emitting device driving circuit unit. One of the paired electrodes is a touch sensing electrode that is connected to the touch sensing circuit unit. The technical features are common among Aspects 1 to 11 of the present invention.

In a preferred embodiment of the present invention, the touch sensing circuit unit and the light-emitting device driving circuit unit are connected to a common ground in view of more efficient achievement in advantageous effects and in designing of a simplified and more effective controlling circuit, which is an object of the present invention.

In a preferred embodiment, the emission term of the organic electroluminescent panel controlled by the light-emitting device driving circuit unit is separated from the touch sensing term of the organic electroluminescent panel controlled by the touch sensing circuit unit and at least one of the paired electrodes or both of the paired electrodes are in a floating potential during the touch sensing term to prevent detection of the capacitance of the organic electroluminescent panel. This configuration can definitely separate the emission term from the sensing term.

In a preferred embodiment, the emission term of the organic electroluminescent panel controlled by the light-emitting device driving circuit unit is separated from the touch sensing term of the organic electroluminescent panel controlled by the touch sensing circuit unit. At least one of the paired electrodes or both of the paired electrodes are in a floating potential and the paired electrodes are short-circuited, during the touch sensing term to prevent detection of the capacitance of the organic electroluminescent panel. This configuration can definitely separate the emission term from the sensing term.

In a preferred embodiment, the organic electroluminescent panel controlled by the light-emitting device driving circuit section is driven to continuously emit light, while the touch sensing term under the control of the touch sensing circuit section intermittently occurs, in view of achievement in a simplified circuit and effective sensing functions.

In a preferred embodiment, the emission term includes a reverse-voltage applying time at the end of the emission term. This configuration can definitely separate the emission term from the sensing term.

In a preferred embodiment, a capacitor is disposed between the lead connecting the light-emitting device driving circuit section to the ground and the lead connecting the touch sensing circuit section to the ground such that the light-emitting device can continuously emit light while the touch sensing term under the control of the touch sensing circuit section occurs intermittently.

In the present invention, the organic EL device includes paired opposite electrodes and an organic functional layer group. The organic EL panel of the present invention includes the organic EL device sealed with a sealing resin and sealing member. The organic EL module of the present invention includes the organic EL panel connected to the capacitive touch sensing circuit unit and the light-emitting device driving circuit unit via an electric connector to provide a light-emitting function and a touch sensing function.

Components of the present invention and embodiments or aspects of the present invention will now be described in detail with reference to the attached drawings. As used herein, the expression to indicating a numerical range is meant to be inclusive of the boundary values. In the description of the drawings, the numbers in parentheses correspond to the reference numerals in the drawings.

<<Organic EL Module>>

An organic EL module of the present invention includes an organic EL panel joined with an electric connector. The electric connector includes a capacitive touch sensing circuit unit and a light-emitting device driving circuit unit including a light-emitting device driving circuit section for driving the organic electroluminescent panel. The organic electroluminescent panel of the organic electroluminescent device includes paired opposite plate electrodes therein. The paired electrodes are connected to the light-emitting device driving circuit unit. One of the paired electrodes functions as a touch sensing electrode that is connected to the touch sensing circuit unit.

Before the detailed description on the configuration of the organic EL module of the present invention, the schematic configuration of a traditional organic EL module in Comparative Example is described.

FIG. 1 is a schematic cross-sectional view of an exemplary organic electroluminescent module in Comparative Example.

An organic EL module (1) in FIG. 1 includes an emission region that is a laminate of, in sequence, a transparent substrate (3), an anode (4), and an organic functional layer unit (5) including, for example, a hole injection layer, a hole transport layer, a luminous layer, an electron transport layer, and an electron injection layer. A cathode (6) is laminated on the organic functional layer unit (5) to give an organic EL device. The outer periphery of the organic EL device is sealed with a sealing adhesive (7). A sealing member (8) is disposed on the sealing adhesive (7) to prevent infiltration of undesirable gases (such as oxygen and water) from the external environment into an emission portion. An organic EL panel (2) is thereby completed.

In the configuration illustrated in FIG. 1, a light-emitting device driving circuit unit (12) for controlling light emission is connected between the paired electrodes, i.e., the anode (4) and the cathode (6). A touch sensing electrode (10) for detecting a touch is provided on a surface, remote from the organic EL device, of the transparent substrate (3) so as to be separated from the organic EL panel (2). The touch sensing electrode (10) consists of an electric connection unit (flexible printed circuit) including, for example, a capacitive touch sensing circuit and a wiring portion disposed on a flexible substrate. The periphery of the touch sensing electrode (10) is sealed with the sealing adhesive (7) to form a touch sensing portion (9). A cover glass (11) is disposed on the top surface of the touch sensing portion (9). The touch sensing electrode (10) is provided with a touch sensing circuit unit (14) for detecting a touch (finger touch). The traditional organic EL module illustrated in FIG. 1, in which the organic EL device and the touch sensing portion (9) are independently provided, inevitably has a large thickness. This hinders reductions in sizes and thicknesses of smart devices, for example.

The basic configuration of the organic EL module according to the present invention will now be described.

FIG. 2 is a schematic cross-sectional view of an exemplary organic electroluminescent module according to the present invention that includes an anode functioning as a touch sensing electrode.

The organic EL module (1) illustrated in FIG. 2 includes an emission region that is a laminate of, in sequence, a transparent substrate (3), an anode (4A), and an organic functional layer unit (5), which is the same as that in FIG. 1. A cathode (6) is laminated on the organic functional layer unit (5) to yield an organic EL device. The outer periphery of the organic EL device is sealed with a sealing adhesive (7). A sealing member (8) is disposed on the sealing adhesive (7) to yield an organic EL panel (2).

The organic EL panel (2) according to the present invention may include an optional metal foil layer on the outermost surface of the organic EL panel (2) for the protection of the organic EL device.

In the configuration illustrated in FIG. 2, the anode (4A), which is a counter electrode to cause the organic EL device to emit light, functions as a touch sensing electrode. In the configuration illustrated in FIG. 2, a light-emitting device driving circuit unit (12) including a light-emitting device driving circuit section for controlling light emission is connected between the anode (4A) and the cathode (6).

The anode (4A) is connected to a touch sensing circuit unit (14) for detecting a touch (finger touch) so as to function as a touch sensing electrode.

Figure 22:
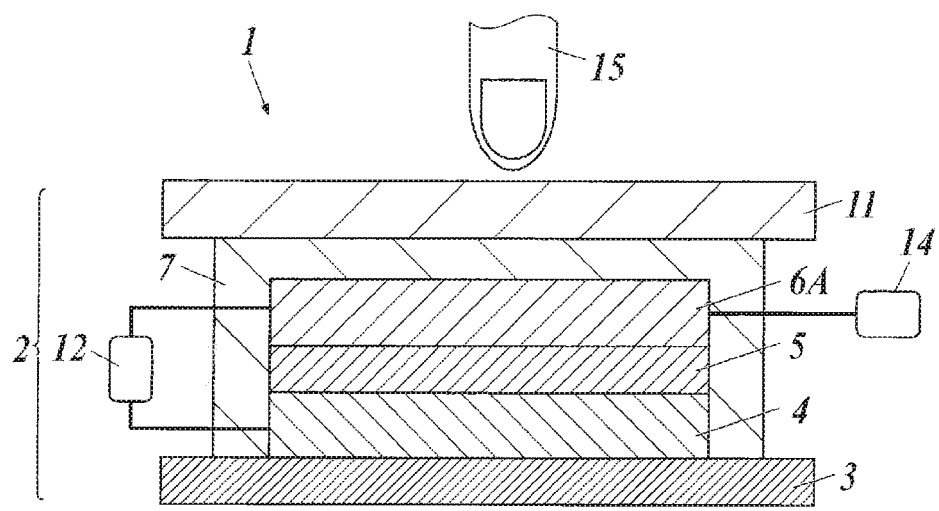
FIG. 22 is a schematic cross-sectional view of another exemplary organic electroluminescent module according to the present invention that includes a cathode functioning as a touch sensing electrode.

The anode (4A) functions as a touch sensing electrode in FIG. 2; alternatively, the cathode (6A) may function as a touch sensing electrode, as illustrated in FIG. 22 described below.

A specific driving circuit for driving the organic EL module according to the present invention and the method of driving the organic EL module will now be described with reference to the attached drawings.

(Exemplary Configuration of Organic EL Module: Touch Sensing Electrode=Anode)

Embodiment 1

FIG. 3 illustrates a driving circuit for driving an organic EL module according to Embodiment 1 of the present invention.

In FIG. 3 illustrating a driving circuit for driving the organic EL module (1), the organic EL panel (2), which is illustrated on the middle of the drawing, includes an anode lead (25) connected to the anode (4A) (not shown) and a cathode lead (26) connected to the cathode (6) (not shown). An organic EL device (22) in the form of a diode and an interelectrode capacitor Cel (21) are connected between the anode lead (25) and the cathode lead (26).

In the light-emitting device driving circuit unit (12), which is illustrated on the left of the drawing, the anode lead (25) extending from the anode (4A) (not shown) is connected to a light-emitting device driving circuit section (23) via a first switch (SW1), and the cathode lead (26) extending from the cathode (6) (not shown) is connected to the light-emitting device driving circuit section (23) via a second switch (SW2). The light-emitting device driving circuit section (23) is also connected to a ground (27). The ground (27) is particularly referred to as a "signal ground".

The light-emitting device driving circuit unit (12) includes a constant-current driving circuit or a constant-voltage driving circuit to control the timing of the light emission of the organic EL device. The light-emitting device driving circuit unit (12) also includes the light-emitting device driving circuit section (23) that applies a reverse bias voltage, as required. The light-emitting device driving circuit section (23), the first and second switches (SW1 and SW2) are independently provided in FIG. 3; alternatively, the first switch (SW1) and/or the second switch (SW2) may be incorporated in the light-emitting device driving circuit section (23), if needed.

The light-emitting device driving circuit unit (12) of the present invention refers to a circuit range including the anode lead (25), the first switch (SW1), the light-emitting device driving circuit section (23), the second switch (SW2), and the cathode lead (26), as surrounded by the dash line in FIG. 3.

The light-emitting device driving circuit section (23) according to the present invention may have any configuration, and thus may be a known light-emitting device driving circuit section (organic EL device driving circuit). For example, a general light-emitting device driving circuit has a function to apply current flowing through the anode and the cathode in accordance with a required intensity of light to be emitted from the light-emitting device or the organic EL device in a predetermined emission pattern illustrated in FIG. 5 described below. A known example of such a light-emitting device driving circuit is a constant-current circuit that includes a step-up or step-down DC-DC converter circuit, a current feedback circuit, and a switch controlling circuit for the DC-DC converter, for example. In addition, the light-emitting device driving circuits described in, for example, Japanese Unexamined Patent Application Publication Nos. 2002-156944, 2005-265937, and 2010-040246 may be applicable.

FIG. 4 illustrates an exemplary light-emitting device driving circuit section (23) applicable to the present invention.

FIG. 4 is a schematic circuit diagram of an exemplary light-emitting device driving circuit unit including a light-emitting device driving circuit section according to the present invention.

In FIG. 4, the light-emitting device driving circuit section (23) includes a set-up or set-down DC-DC converter circuit (31), a switching controlling circuit (32) for the DC-DC converter, and a current feedback circuit (33). For example, the anode potential of the organic EL device (22) is raised or dropped at the DC-DC converter circuit (31) so that the current $I_{OLED}$ flowing into the organic EL device (22) becomes $V_{ref}/R_1$, where $R_1$ is sensing resistance and $V_{ref}$ is comparative potential. Such a configuration allows the light-emitting device driving circuit section (23) to function as a constant-current circuit. An output $V_{out}$ from the DC-DC converter circuit (31) is fed back to the feedback circuit (33) such that $V_x=V_{ref}$ is satisfied. For example, if $V_{ref}$ is 0.19 V and $R_1$ is 100Ω, the DC-DC converter circuit (31) controls $V_{out}$ such that the constant-current value $V_{ref}/R_1$ is 1.9 mA.

In the touch sensing circuit unit (14), which is illustrated on the right of the drawing, the anode lead (25) extending from the anode (4A) (not shown) functioning as a touch sensing electrode is connected to the touch sensing circuit section (24) via a third switch (SW3), and the touch sensing circuit section (24) is connected to the ground (27). The touch sensing circuit section (24) may include the third switch (SW3) therein.

The touch sensing circuit section (24) may have any configuration, and thus may be a known touch sensing circuit section. A general touch sensing circuit includes, for example, an amplifier, a filter, an AD converter, a rectification smoothing circuit, and a comparator. Representative examples of the touch sensing circuit include a self-capacitive sensing circuit and a series capacitive voltage divider circuit (of an Omron type). In addition, the touch sensing circuits described in, for example, Japanese Unexamined Patent Application Publication Nos. 2012-073783, 2013-088932, and 2014-053000 may be applicable.

The first to third switches (SW1 to SW3) may be of any type, for example, a field-effect transistor (FET) and a thin-film transistor (TFT).

The time-series operation of the emission term and the sensing term in Embodiment 1 described in FIG. 3 will now be described with reference to a timing chart.

Figure 5:
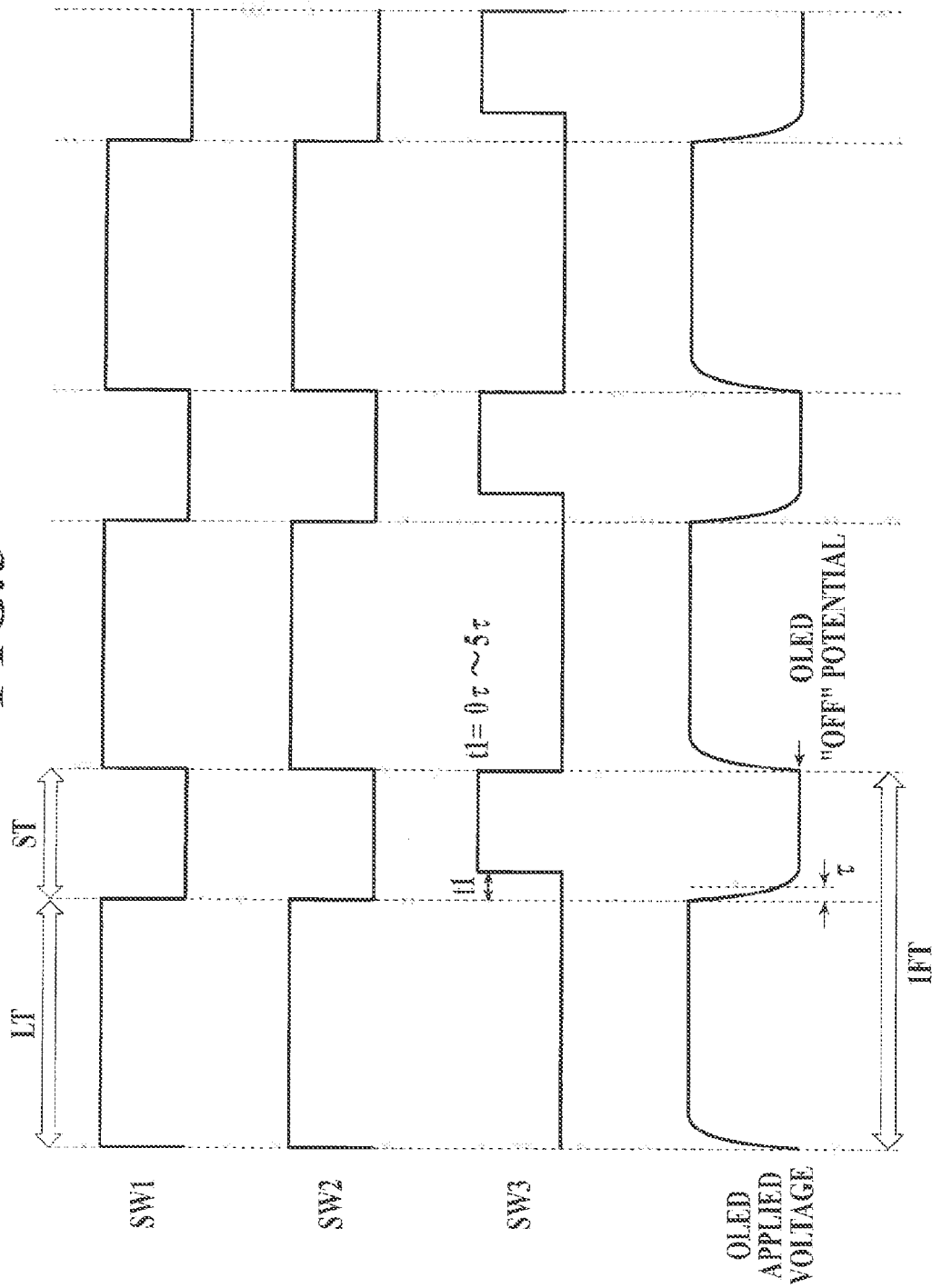
FIG. 5 is a timing chart illustrating an exemplary emission term and an exemplary sensing term in Embodiment 1.

FIG. 5 is a timing chart illustrating an exemplary emission term and an exemplary sensing term in Embodiment 1.

For the organic EL module (1) having the driving circuit configuration illustrated in FIG. 3, the emission term of the organic EL panel controlled by the light-emitting device driving circuit unit (12) and the touch sensing term of the organic EL panel controlled by the touch sensing circuit unit (14) are separately operated by turning on/off the switches. This can achieve a touch sensing function in an icon region.

The first chart in the uppermost column in FIG. 5 illustrates the on/off operation timing of the first switch (SW1) in the light-emitting device driving circuit unit (12). Likewise, the second and third charts in the middle column each illustrate the operation timings of the second and third switches (SW2 and SW3). In these charts, the switches are turned on during the high terms. The same is applied to the timing charts described below.

The chart in the lowermost column illustrates the history of the applied voltage to the organic EL device. After the first and second switches (SW1 and SW2) are turned on, the voltage increases from the OLED off voltage to a certain voltage required for light-emission, so that the light emission starts. The first and second switches (SW1 and SW2)

are then turned off, so that the current supply to the OLED is stopped to stop the light emission. The light is not instantly quenched after the turning-off of the first and second switches (SW1 and SW2) and is still emitted for a predetermined term (t1) depending on an OLED charge/discharge time constant T.

The third switch (SW3) is a switch that controls the operation of the touch sensing circuit unit (14). The third switch (SW3) is turned off while the first and second switches (SW1 and SW2) are being turned on. The first and second switches (SW1 and SW2) are turned off, and then the third switch (SW3) is turned on to perform a touch detection. It should be noted that the third switch (SW3) is turned on after a predetermined waiting term (t1) after the turn-off of the first and second switches (SW1 and SW2). The OLED charge/discharge time constant in the waiting term (t1) is preferably within the range of 0 τ to 5 τ.

In the timing chart illustrated in FIG. 5, the term from the turning-on to the turning-off of the first and second switches (SW1 and SW2) is referred to as a emission term (LT), and the term from the turning-off of the first and second switches (SW1 and SW2) to the turning-off of the third switch (SW3) is referred to as a sensing term (ST), wherein the sensing term (ST) includes the waiting term (t1), and the turning-on time of the third switch (SW3) for touch detection. The term LT+ST is referred to as one frame term (1FT).

The emission term (LT), the sensing term (ST), and one frame term (1FT) for the organic EL module of the present invention each may have any value, and an appropriate value can be selected depending on the environment. For example, the emission term (LT) of the OLED may be in the range of 0.1 to 2.0 msec., the sensing term (ST) may be in the range of 0.05 to 0.3 msec., and the one frame term (1FT) may be in the range of 0.15 to 2.3 msec. The frame terms preferably have a frequency of 60 Hz or greater to reduce flicker.

Figure 6:
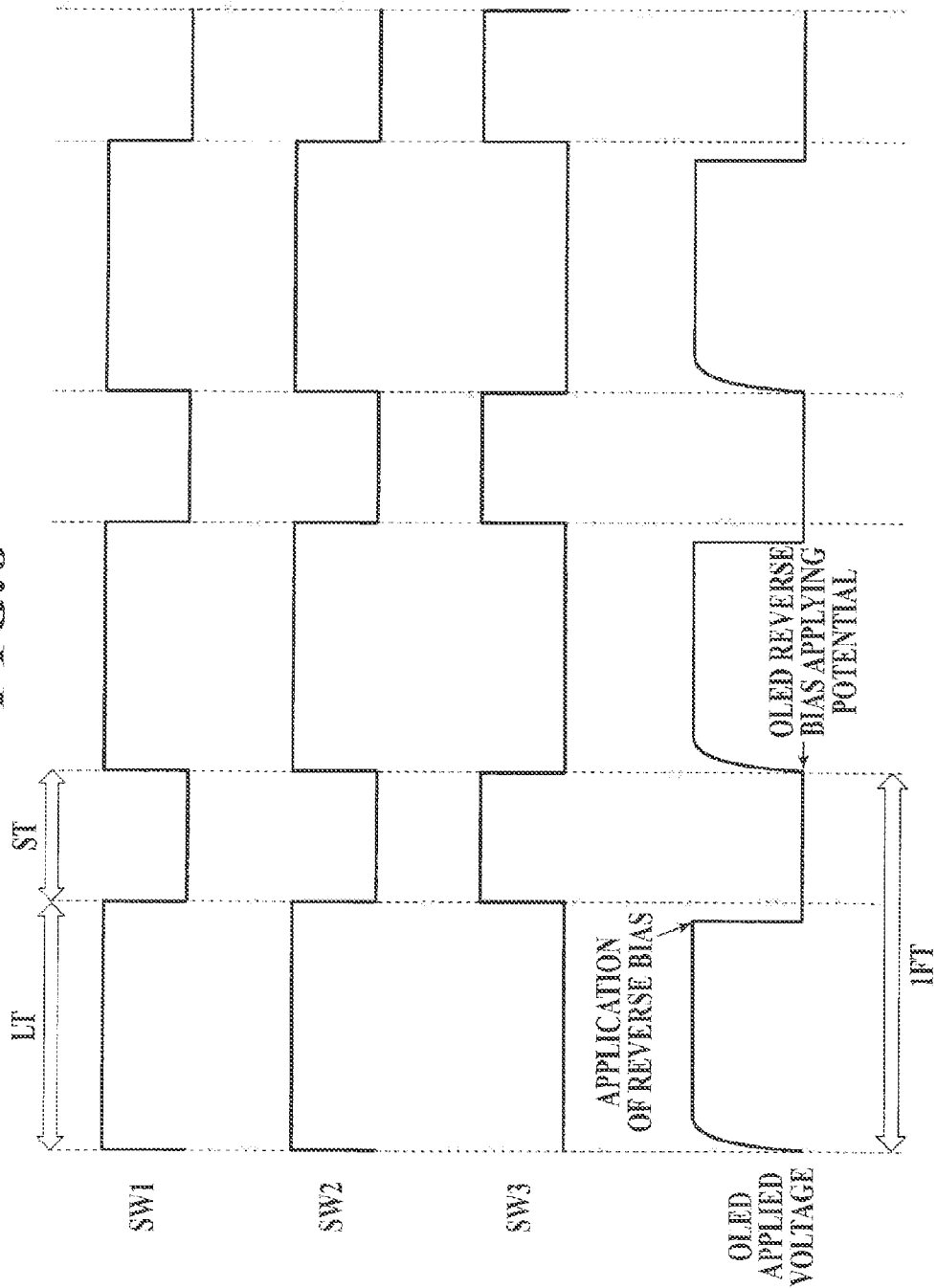
FIG. 6 is a timing chart illustrating another exemplary emission term and sensing term (in the case of reverse voltage application) in Embodiment 1.

FIG. 6 is a timing chart illustrating another exemplary emission term and sensing term in Embodiment 1 in which a reverse bias voltage is applied to the OLED.

In contrast to the pattern of voltage application to the OLED illustrated in FIG. 5, a reverse bias voltage is applied to across the anode and the cathode at the end of the emission term immediately before the turning-off of the first and second switches (SW1 and SW2) to prevent charge and discharge at the turned-off time of the OLED in the timing chart illustrated in FIG. 6. Thus, the third switch (SW3) has no waiting term (t1) illustrated in FIG. 5.

Figure 7:
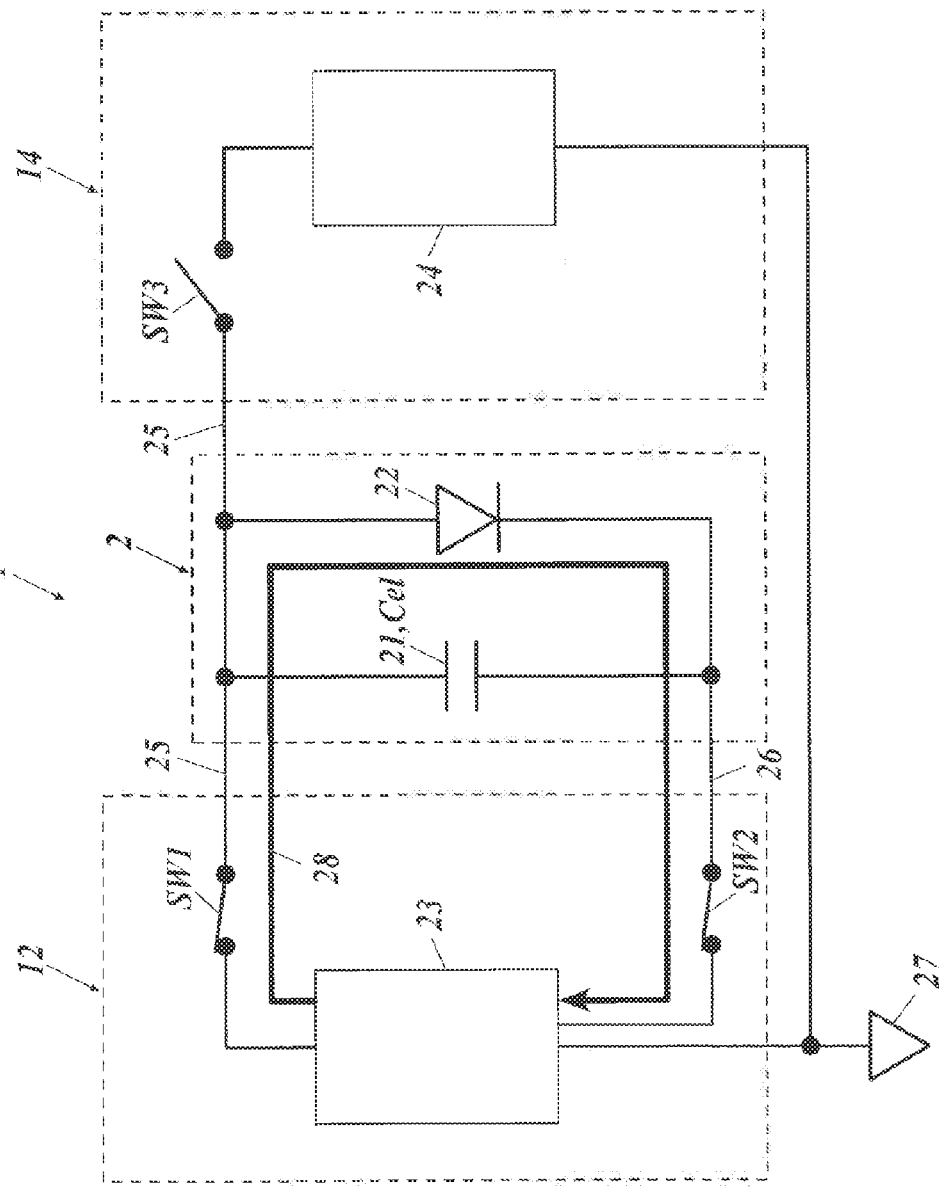
FIG. 7 is an operational circuit diagram illustrating an exemplary circuit operation in the emission term in Embodiment 1.

FIG. 7 is an operational circuit diagram illustrating an exemplary circuit operation in the emission term (LT) in Embodiment 1.

As illustrated in FIG. 7, the first and second switches (SW1 and SW 2) are turned on in the emission term (LT) in Embodiment 1, and the emission condition is controlled with the light-emitting device driving circuit section (23), so that the organic EL device (22) emits light through the emission controlling information route (28).

In this case, the third switch (SW3) connected to the touch sensing circuit unit (14) is turned off.

Figure 8:
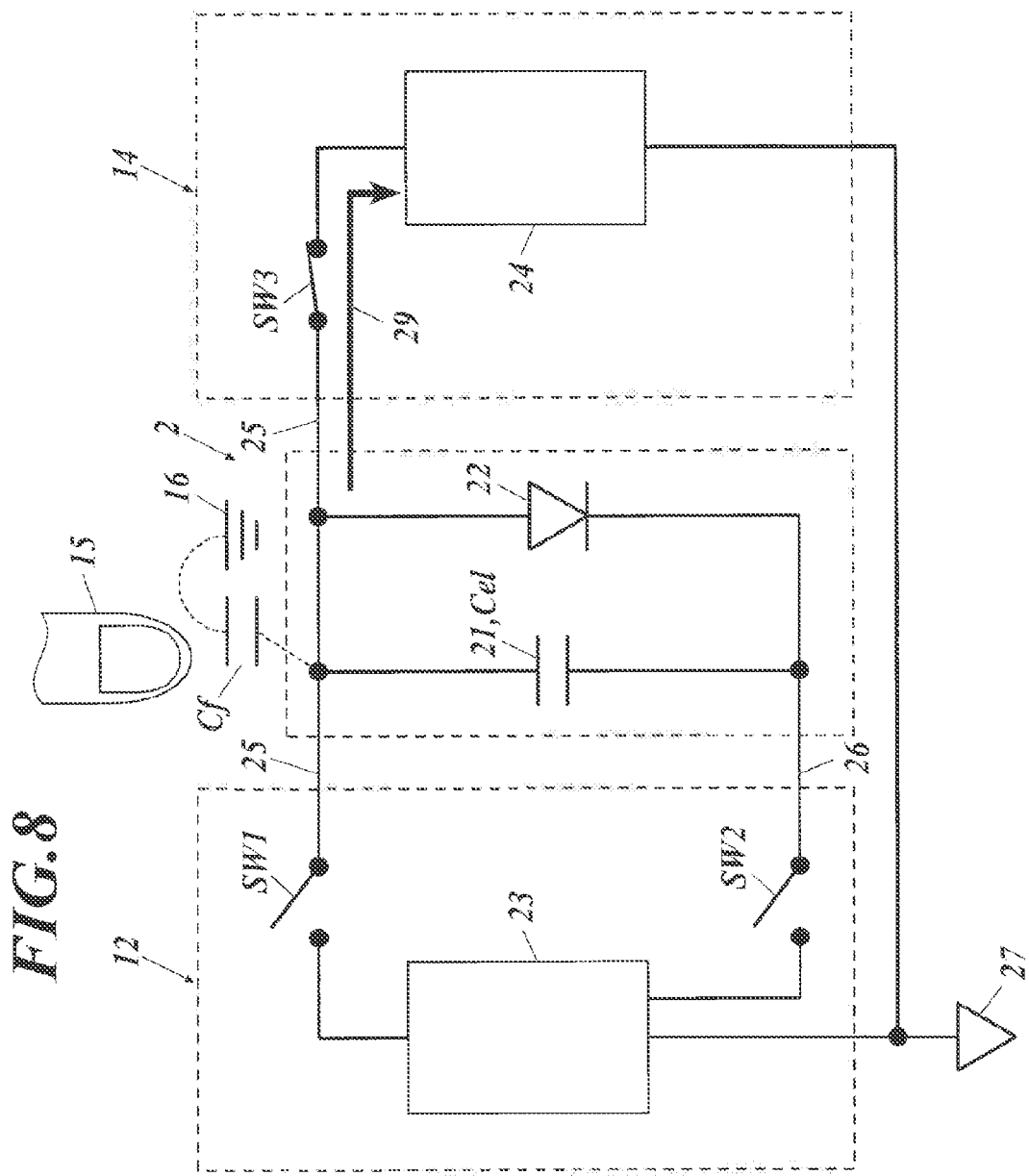
FIG. 8 is an operational circuit diagram illustrating an exemplary circuit operation in the sensing term in Embodiment 1.

FIG. 8 is an operational circuit diagram illustrating an exemplary circuit operation in the sensing term (ST) in Embodiment 1.

With reference to FIG. 8, the first and second switches (SW1 and SW2) of the light-emitting device driving circuit unit (12) are turned off to open the light-emitting device driving circuit, and the top surface of the glass substrate of the anode (4A) (not shown) functioning as a touch sensing electrode of the organic EL panel (2) is touched by a finger (15) while the third switch (SW3) of the touch sensing circuit unit (14) is turned on, resulting in finger capacitance (Cf) between the finger (15) and the anode (4A) functioning as a touch sensing electrode. The finger capacitor (Cf) is connected to the ground (16). A touch sensing information route 29 is used in the sensing term.

In this case, the first and second switches (SW1 and SW2) are turned off, and the paired electrodes are in a floating potential so that the capacitance of the organic EL panel is not detected. Thus, the finger capacitance Cf is greater than the interelectrode capacitance Cel, and the touch sensing is achieved.

Embodiment 2

Figure 9:
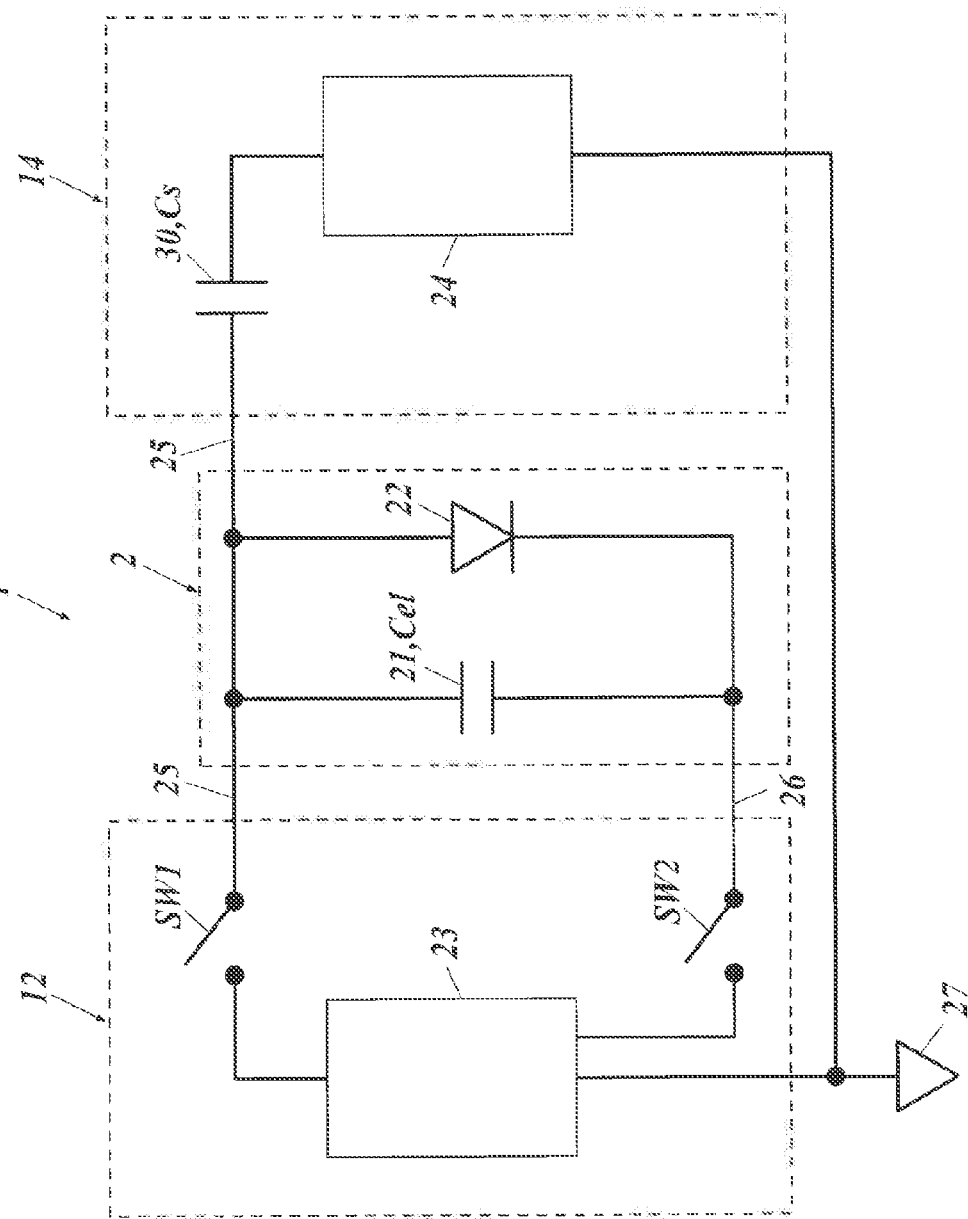
FIG. 9 is a driving circuit diagram of an organic electroluminescent module according to Embodiment 2.

FIG. 9 is a driving circuit diagram of an organic EL module according to Embodiment 2 of the present invention.

The organic EL module of Embodiment 2 illustrated in FIG. 9 has the same driving circuit as that of Embodiment 1 illustrated in FIG. 3, except that the third switch (SW3) of the touch sensing circuit unit (14) is replaced with a switch capacitor Cs (30). The capacitor Cs (30) incorporated in the circuit has the same function as the third switch (SW3).

The light-emitting device driving circuit section (23) may include the first switch (SW1) and the second switch (SW2) therein. The touch sensing circuit section (24) may include the capacitor Cs (30) therein.

Figure 10:
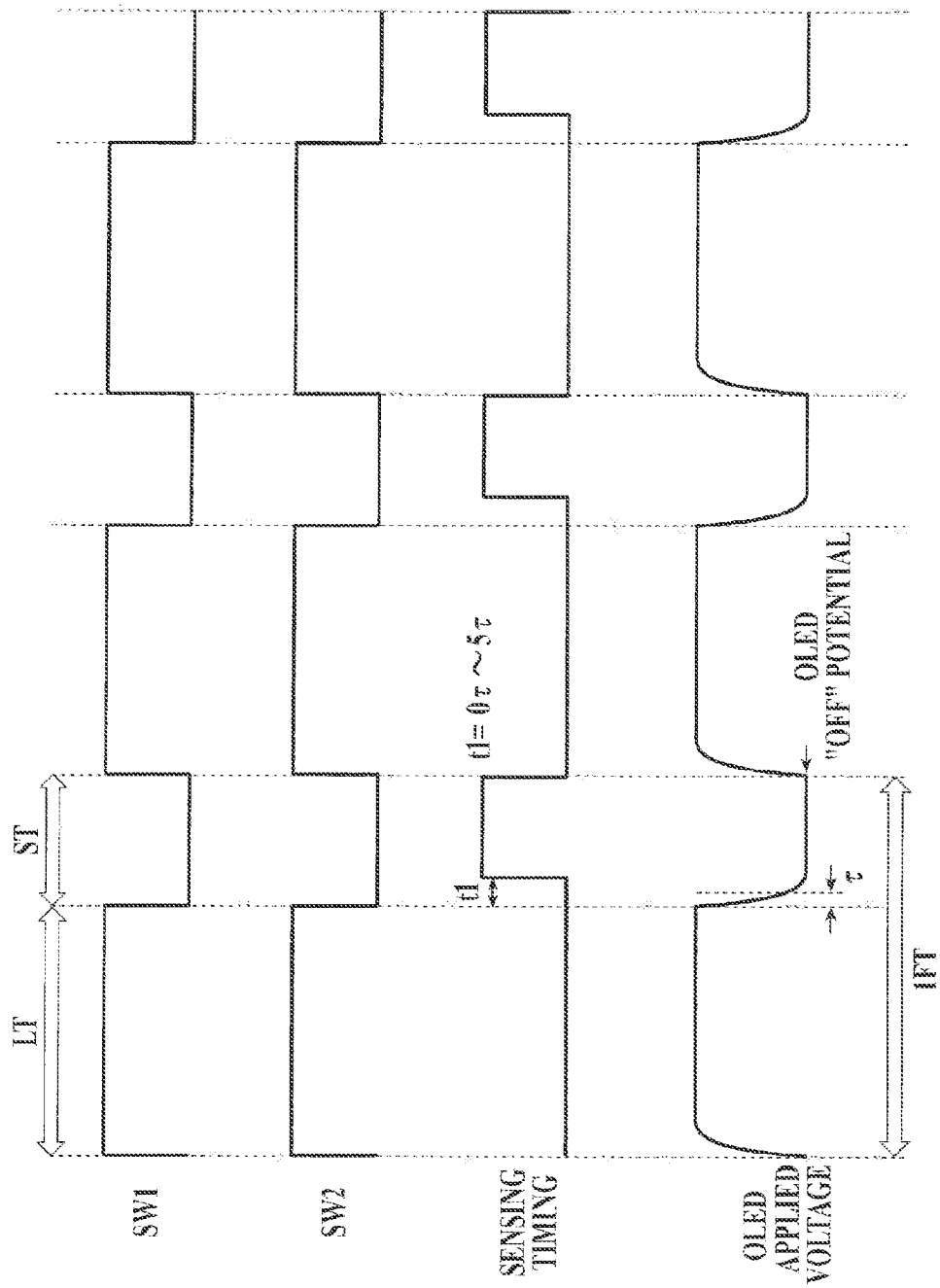
FIG. 10 is a timing chart illustrating an exemplary emission term and an exemplary sensing term in Embodiment 2.

FIG. 10 is a timing chart illustrating an exemplary emission term and an exemplary sensing term in Embodiment 2 in which the waiting term (t1) is provided in the sensing timing.

In contrast to the timing chart illustrated in FIG. 5, the sensing timing is controlled not by the turning-on/off of the third switch (SW3), but by the switch capacitor Cs (30) in the timing chart illustrated in FIG. 10.

Figure 11:
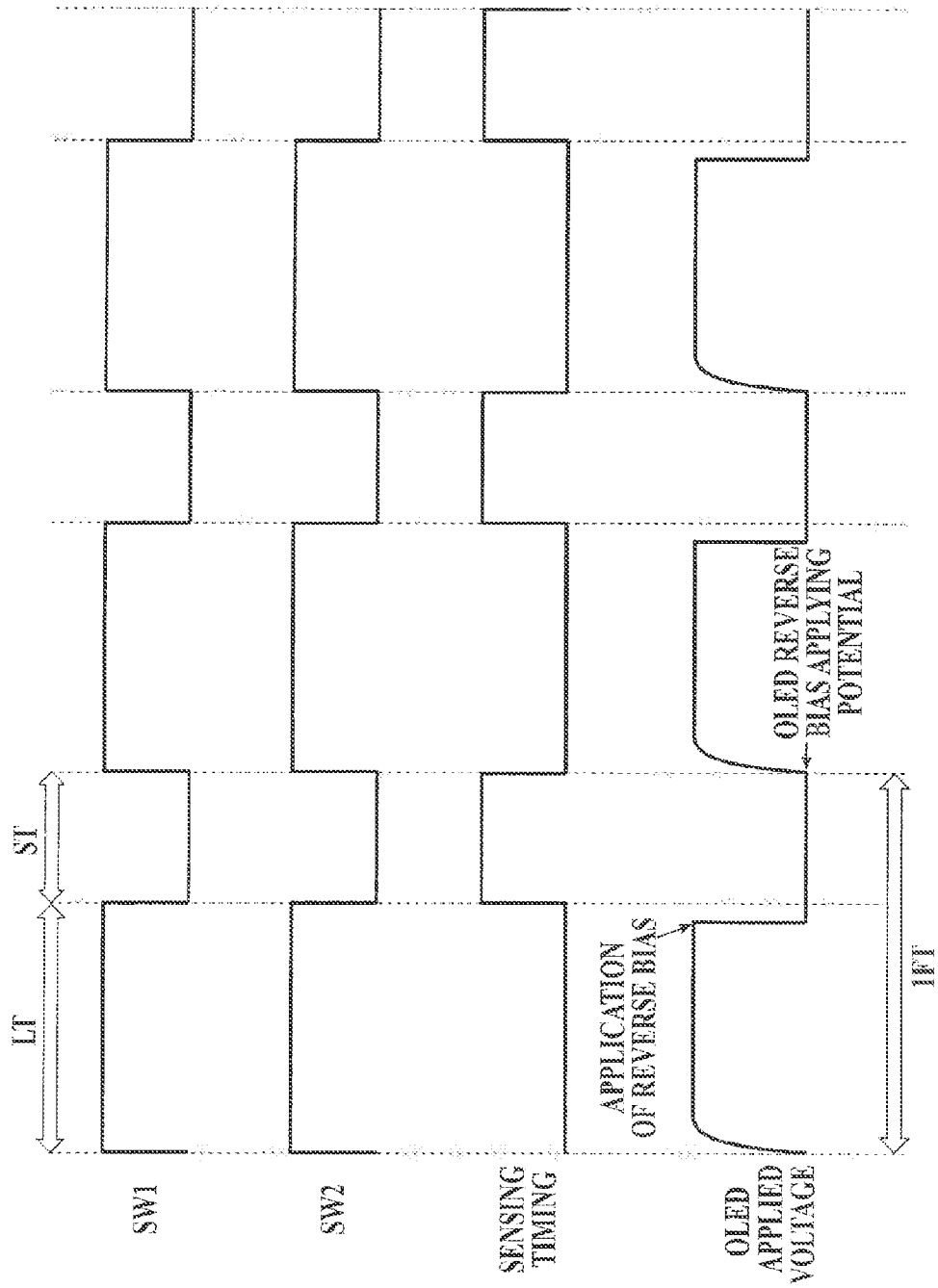
FIG. 11 is a timing chart illustrating another exemplary emission term and sensing term (in the case of reverse voltage application) in Embodiment 2.

FIG. 11 is a timing chart illustrating another exemplary emission term and sensing term in Embodiment 2 in which a reverse bias voltage is applied to the OLED during an exemplary circuit operation in the sensing term in Embodiment 2.

In contrast to the timing chart illustrated in FIG. 6, the sensing timing is controlled not by the turning-on/off of the third switch (SW3), but by the switch capacitor Cs (30) in the timing chart illustrated in FIG. 11 in which a reverse bias voltage is applied to the OLED.

Figure 12:
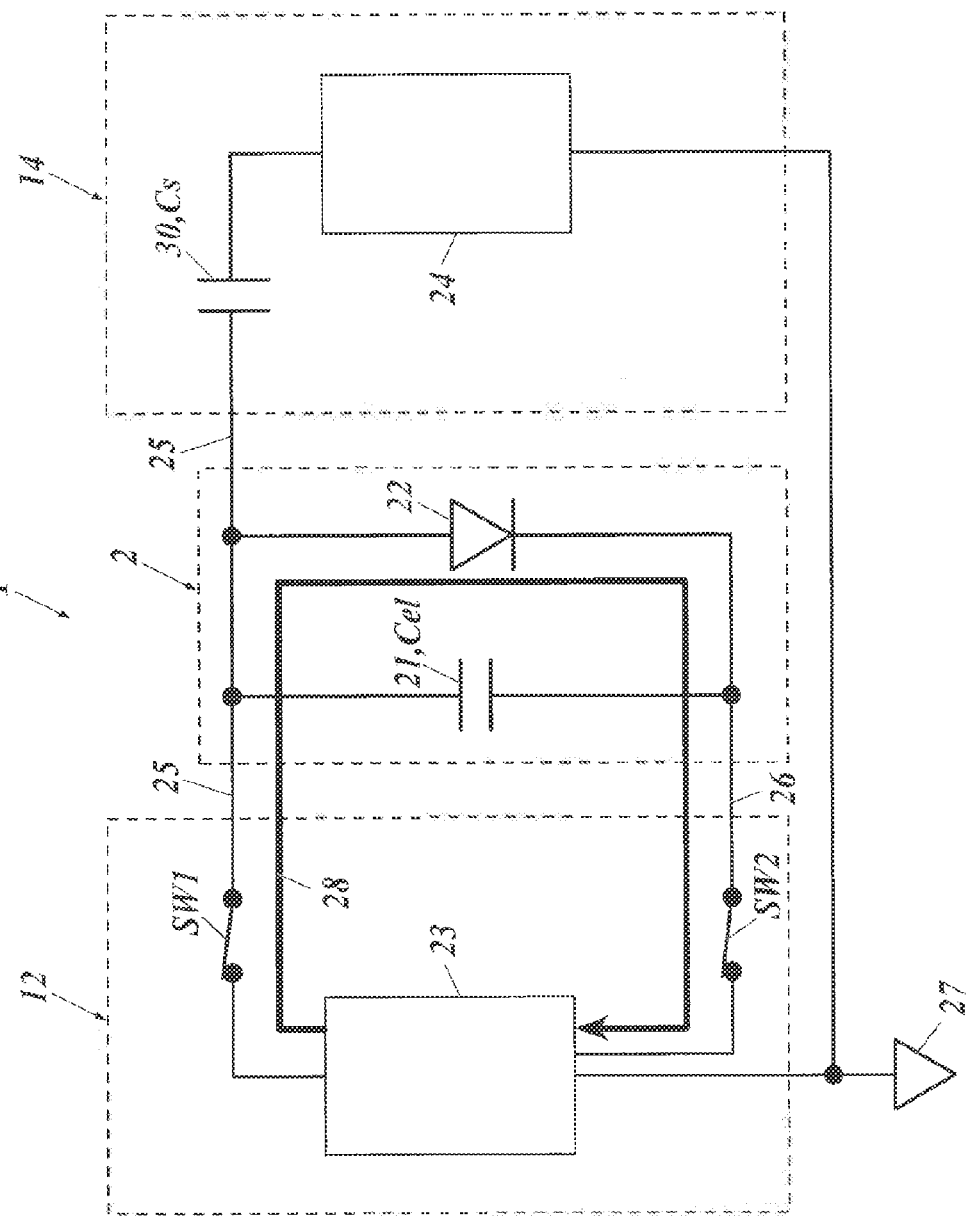
FIG. 12 is an operational circuit diagram illustrating an exemplary circuit operation in the emission term in Embodiment 2.

FIG. 12 is an operational circuit diagram illustrating an exemplary circuit operation in the emission term in Embodiment 2 and is similar to that in the emission term in Embodiment 1 illustrated above in FIG. 7.

Figure 13:
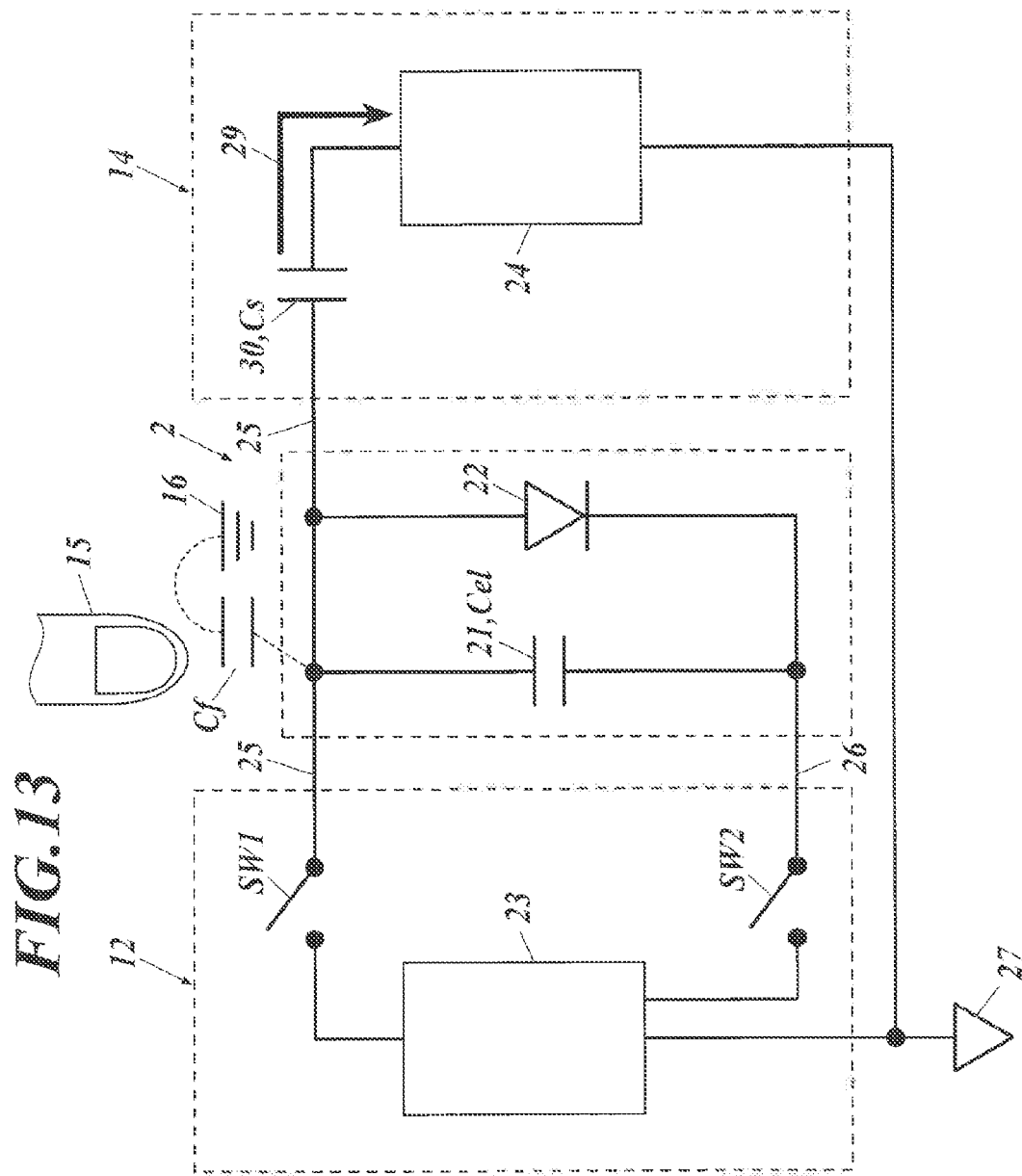
FIG. 13 is an operational circuit diagram illustrating an exemplary circuit operation in the sensing term in Embodiment 2.

FIG. 13 is an operational circuit diagram illustrating an exemplary circuit operation in the sensing term in Embodiment 2. The first and second switches (SW1 and SW2) of the light-emitting device driving circuit unit (12) are turned off to open the light-emitting device driving circuit, and the top surface of the glass substrate of the anode (4A) (not shown) functioning as a touch sensing electrode is touched by a finger (15). This operation generates finger capacitance (Cf) between the finger (15) and the anode (4A) functioning as a touch sensing electrode and achieves touch sensing.

Figure 14A:
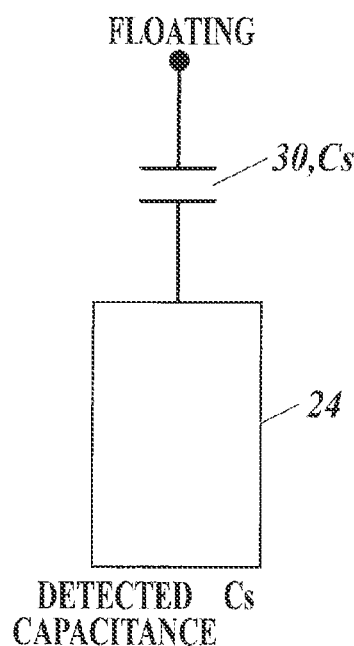
FIG. 14A is a first schematic diagram illustrating the differential capacitance between in the emission term and in the sensing term (during finger touch) in Embodiment 2.
Figure 14B:
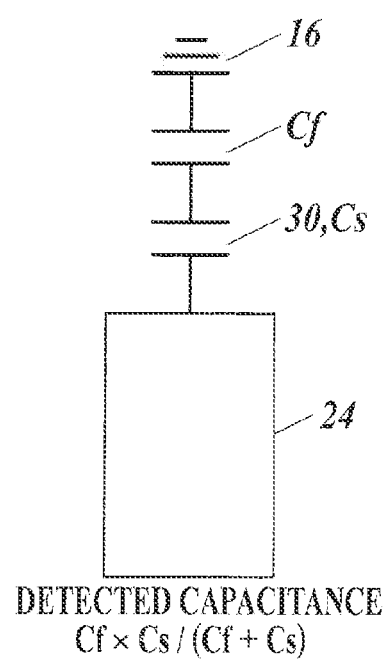
FIG. 14B is a second schematic diagram illustrating the differential capacitance between in the emission term and in the sensing term (during finger touch) in Embodiment 2.

FIGS. 14A and 14B are schematic diagrams illustrating the difference in capacitance between in the emission term and in the sensing term (during finger touch) in Embodiment 2. As illustrated in FIG. 14A, in the state of no finger touch, one of the electrodes is in a floating potential, and the switch capacitance Cs (30) is not detected in the touch sensing circuit unit (14). In contrast, in the sensing term (during finger touch) illustrated in FIG. 14B, the capacitance is a series combination of the finger and switch capacitances Cf and Cs between the finger (15) and the anode (4A) functioning as a touch sensing electrode, and thus the touch is detected.

Embodiment 3

Figure 15:
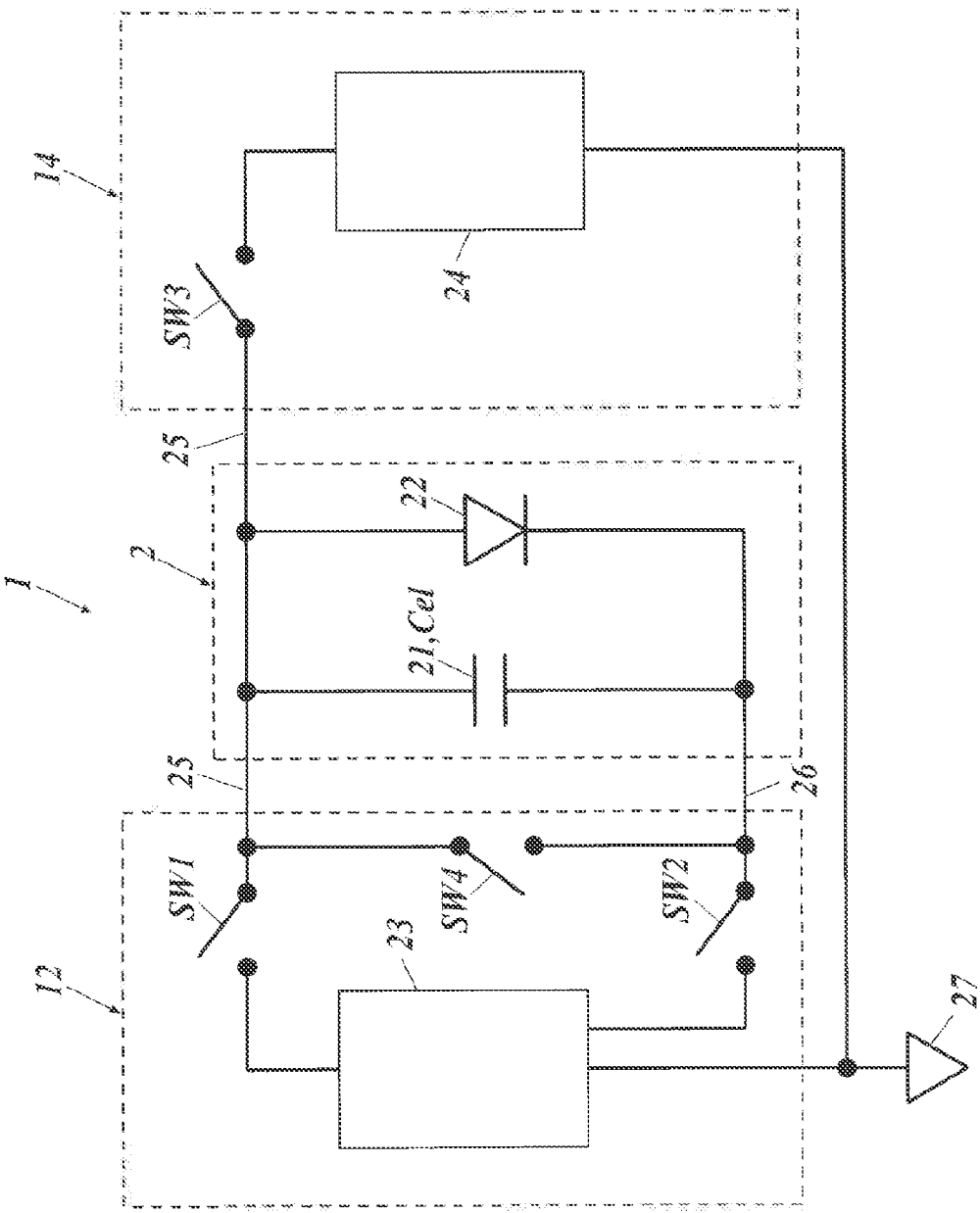
FIG. 15 is a driving circuit diagram of an organic electroluminescent module according to Embodiment 3.

FIG. 15 is a driving circuit diagram of an organic EL module according to Embodiment 3 of the present invention.

The organic EL module (1) illustrated in FIG. 15 has the same drive circuit as that illustrated above in FIG. 3, except that a fourth switch (SW4) is provided between the anode lead (25) and the cathode lead (26) for short circuit.

The light-emitting device driving circuit section (23) may include the first switch (SW1) and/or the second switch (SW2) therein. The touch sensing circuit section (24) may include the third switch (SW3) therein.

Figure 16:
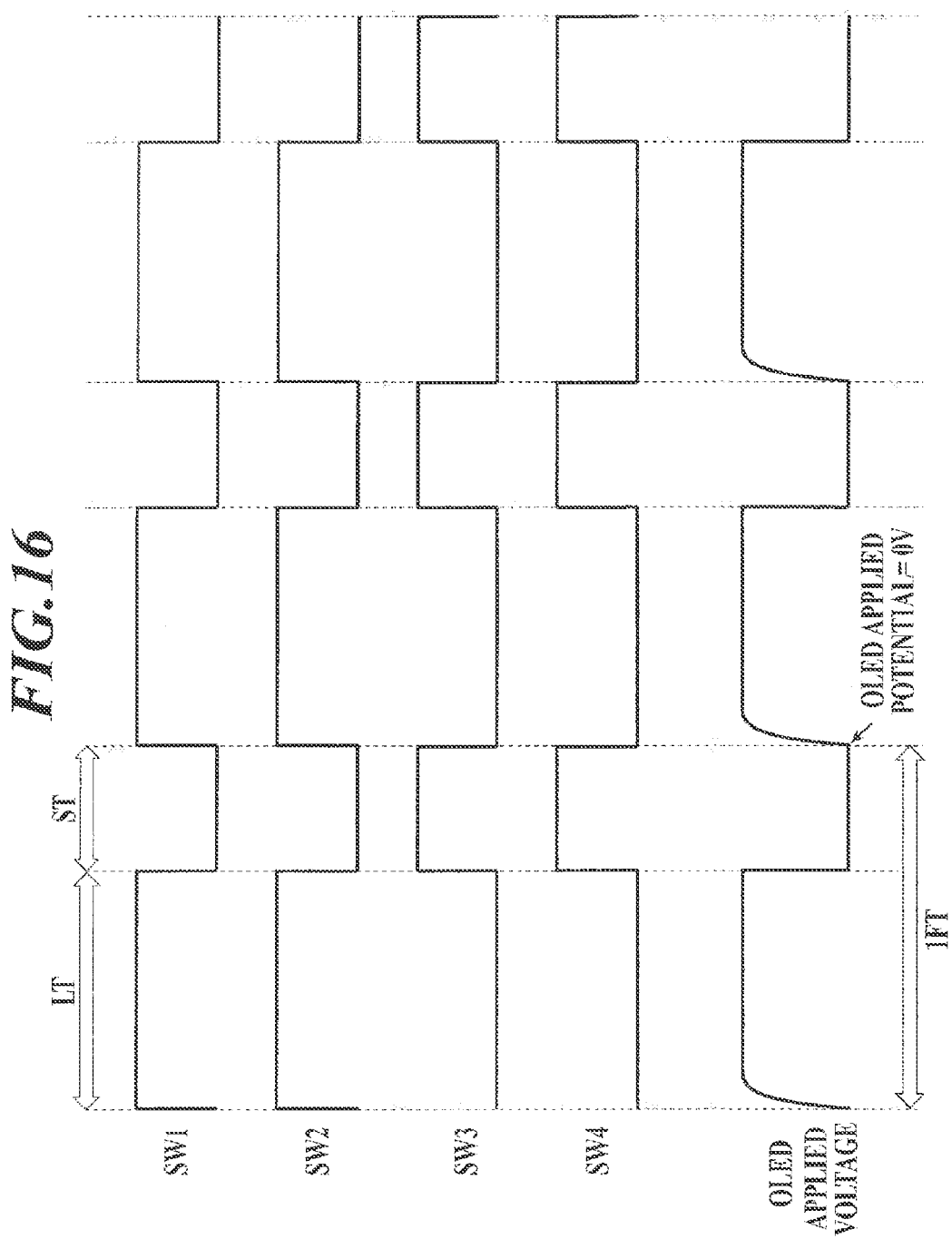
FIG. 16 is a timing chart illustrating an exemplary emission term and an exemplary sensing term in Embodiment 3.

FIG. 16 is a timing chart illustrating an exemplary emission term and sensing term in Embodiment 3.

In contrast to the timing chart illustrated in FIG. 5, the first and second switches (SW1 and SW2) in the timing chart illustrated in FIG. 16 including the fourth switch (SW4) are turned on throughout the emission term (LT) to activate the OLED, and then the first and second switches (SW1 and SW2) are turned off while the third and fourth switches (SW3 and SW4) are being turned on at the start of the sensing term (ST). The fourth switch (SW4) (i.e., short circuit switch) is turned on to instantaneously remove charge/discharge components remaining between the electrodes of the OLED, resulting in transition from the emission term (LT) to the sensing term (ST) without provision of the waiting term (t1).

Figure 17:
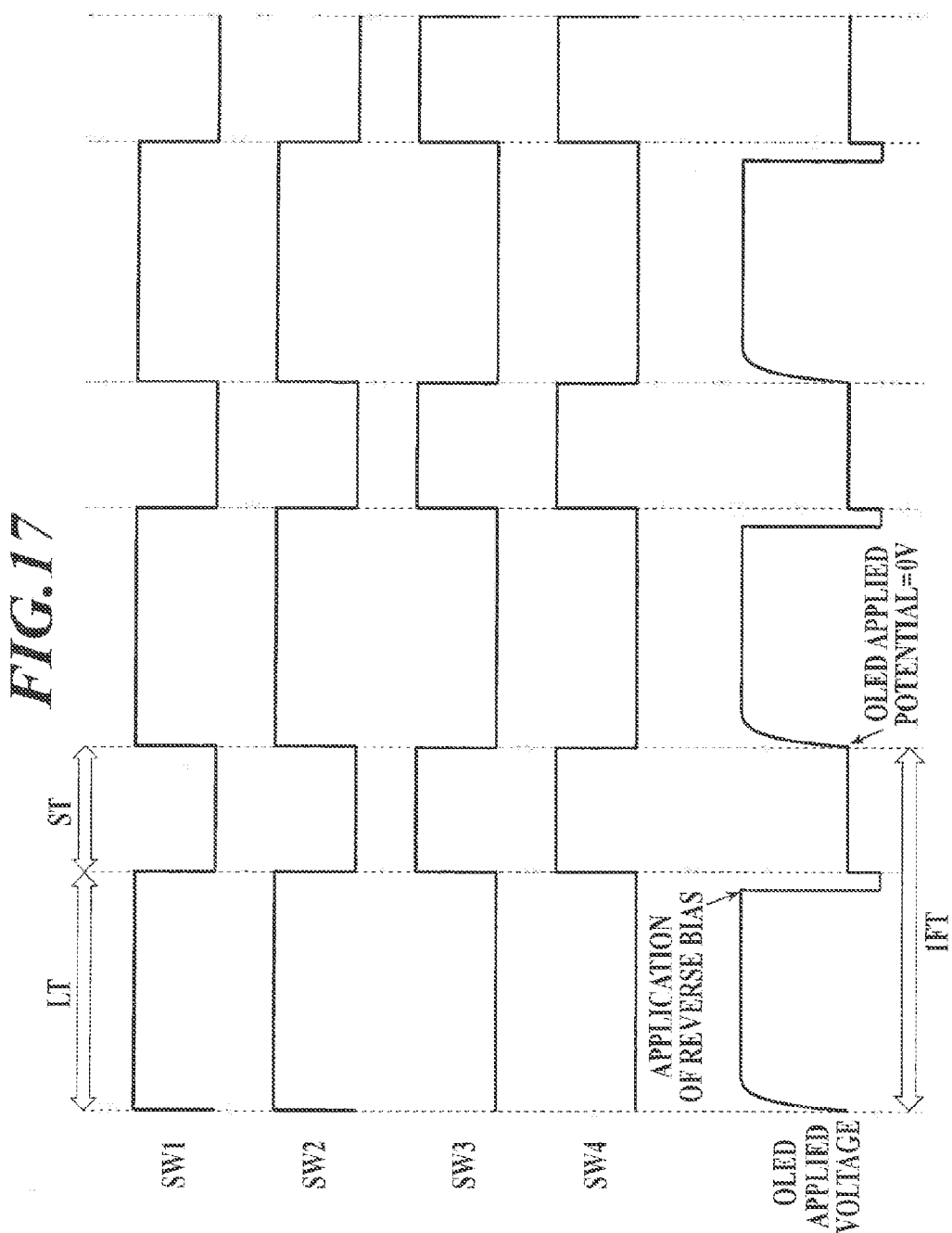
FIG. 17 is a timing chart illustrating another exemplary emission term and sensing term (in the case of reverse voltage application) in Embodiment 3.

FIG. 17 is a timing chart illustrating another exemplary emission term and sensing term in Embodiment 3 in which a reverse bias voltage is applied to the OLED.

In contrast to the timing chart illustrated in FIG. 16, in the timing chart illustrated in FIG. 17, a reverse voltage is applied (reverse bias voltage application) between the anode and the cathode at the end of the emission term, i.e., after the turning-on of the first and second switches (SW1 and SW2) and immediately before the turning-off of these switches to prevent charge and discharge at the time of extinction of the OLED.

Figure 18:
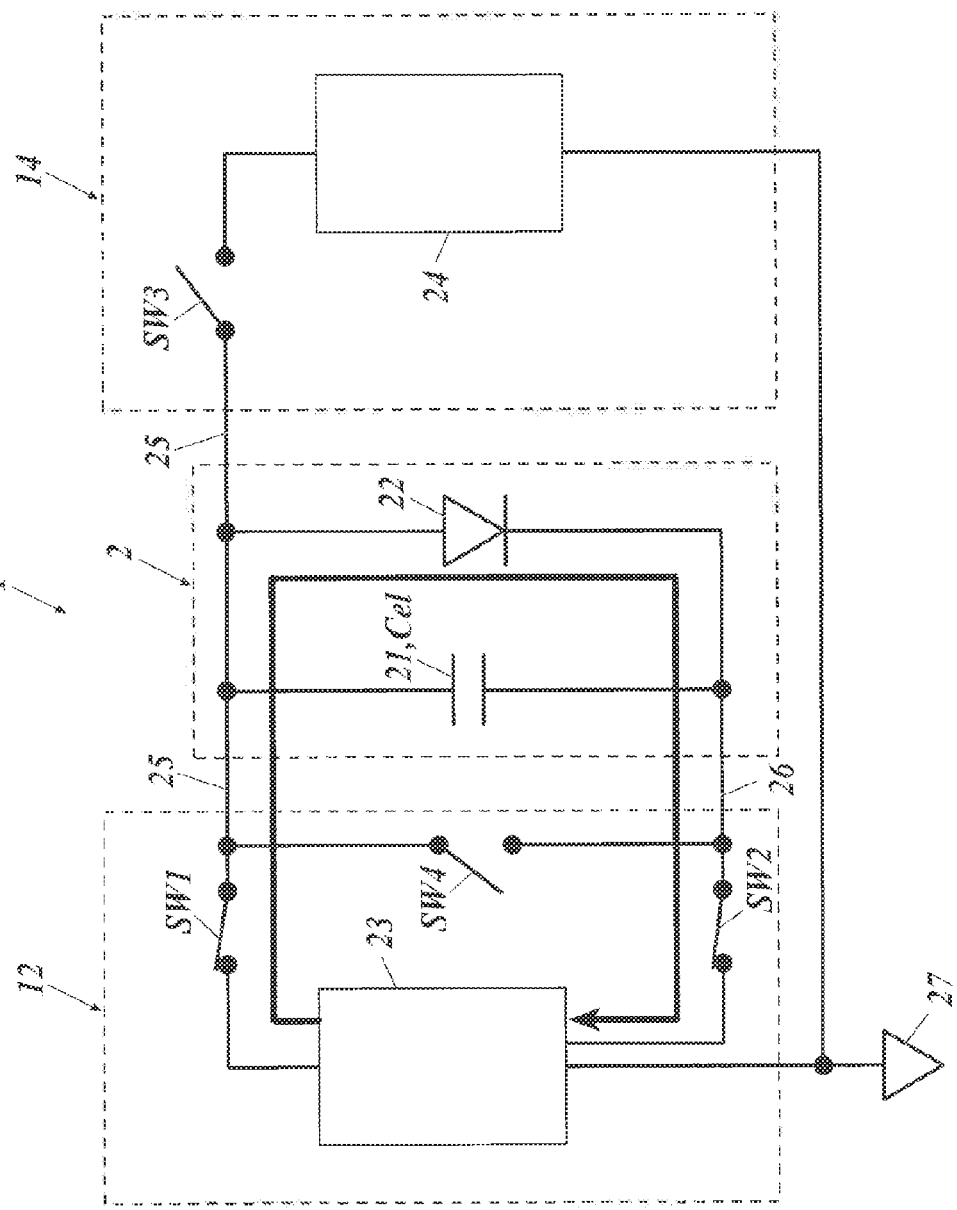
FIG. 18 is an operational circuit diagram illustrating an exemplary circuit operation in the emission term in Embodiment 3.

FIG. 18 is an operational circuit diagram illustrating an exemplary circuit operation in the emission term in Embodiment 3.

In the emission term illustrated in FIG. 18, the first and second switches (SW1 and SW2) of the light-emitting device driving circuit unit (12) are turned on and the fourth switch (SW4) is turned off, and the circuit operation is the same as that illustrated in FIG. 7.

Figure 19:
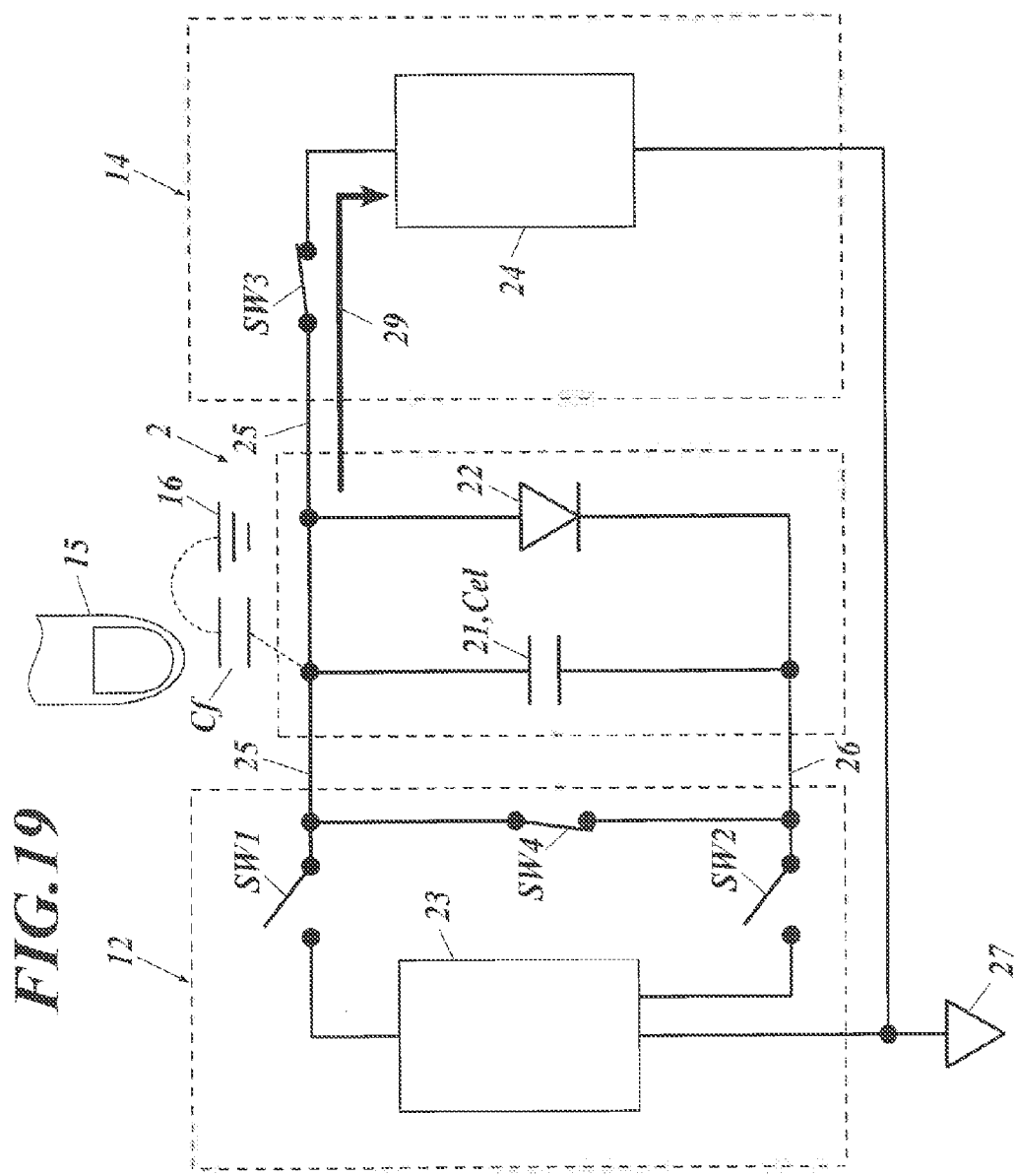
FIG. 19 is an operational circuit diagram illustrating an exemplary circuit operation in the sensing term in Embodiment 3.

FIG. 19 is an operational circuit diagram illustrating an exemplary circuit operation in the sensing term in Embodiment 3. The first and second switches (SW1 and SW2) of the light-emitting device driving circuit unit (12) are turned off to open the light-emitting device driving circuit, and the top surface of the glass substrate of the anode (4A) (not shown) functioning as a touch sensing electrode is touched by a finger (15). This operation generates finger capacitance (Cf) between the finger (15) and the anode (4A) functioning as a touch sensing electrode and achieves touch sensing. In this case, the charge/discharge between the counter electrodes is instantaneously performed by turning on the fourth switch (SW4) of the light-emitting device driving circuit unit (12).

As illustrated in FIGS. 15 to 19, the turning-on/off control of the touch sensing circuit unit (14) is performed with the third switch (SW3). The third switch (SW3) may be replaced with the capacitor (30) as illustrated above in Embodiment 2.

Embodiment 4

Figure 20:
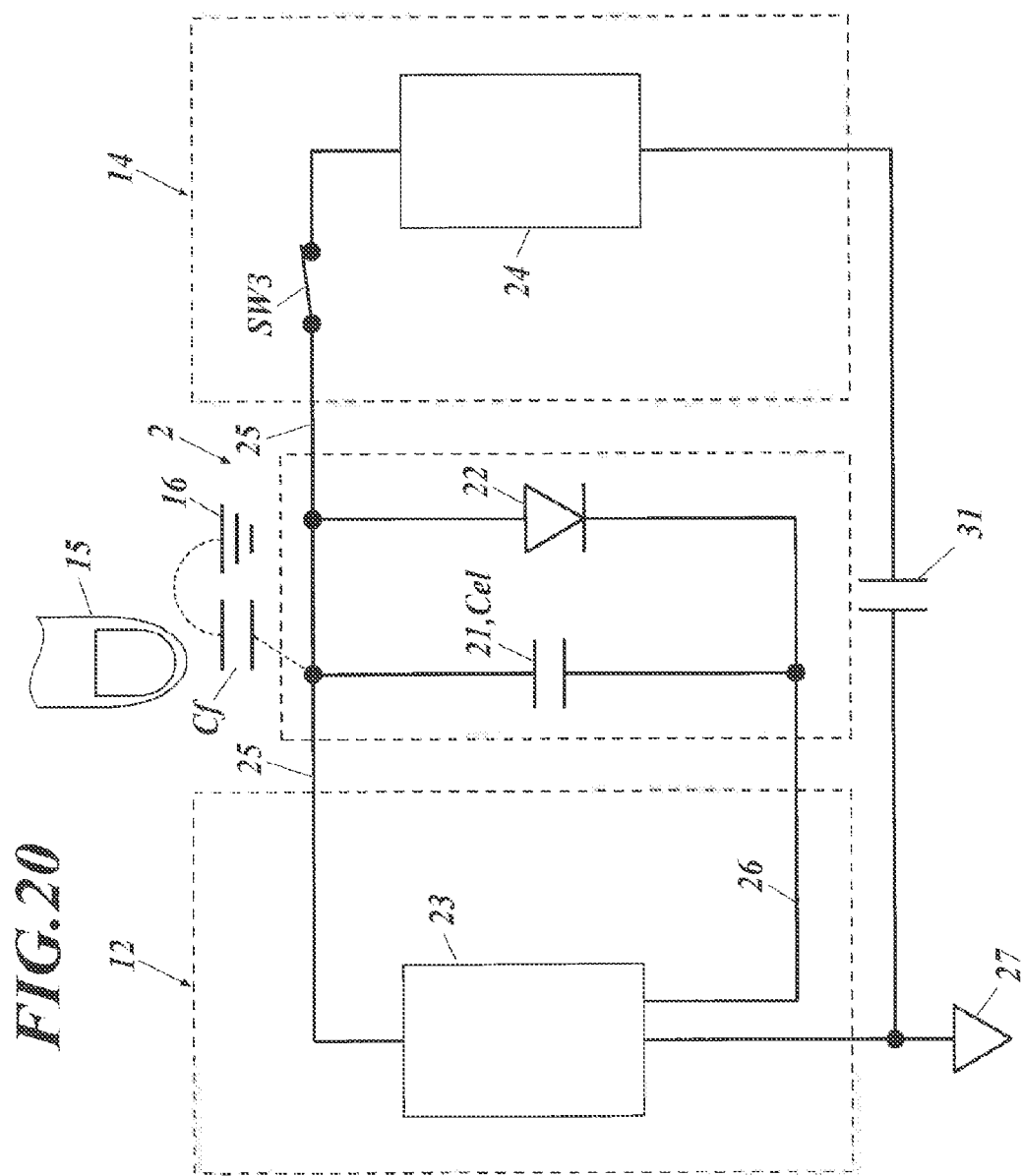
FIG. 20 is a driving circuit diagram during finger touch of an organic electroluminescent module according to Embodiment 4.

FIG. 20 is a driving circuit diagram during finger touch of an organic electroluminescent module according to Embodiment 4. In this module, the organic electroluminescent panel controlled by the light-emitting device driving circuit section continuously emits light, and the sensing term (ST) periodically occurs under the control of the touch sensing circuit section (24). Specifically, the organic electroluminescent module has the same driving circuit as that illustrated in FIG. 3, except that the first and second switches (SW1 and SW2) are omitted, and a capacitor (31) is provided on the lead connecting the light-emitting device driving circuit section (23) and the ground of the touch sensing circuit section (24).

With reference to FIG. 20, the light-emitting device driving circuit unit (12) has no switch, and thus the circuit is always closed, resulting in continuous emission of light from the organic EL device (22).

In contrast, in the touch sensing circuit unit (14) illustrated at the right side, the anode lead (25) extracted from the anode (4A) (not shown) functioning as a touch sensing electrode is connected to the touch sensing circuit section (24) via the third switch (SW3). This touch sensing circuit section is connected to the ground (27) via the capacitor (31).

As illustrated in FIG. 20, the third switch (SW3) of the touch sensing circuit unit (14) is turned on, and the top surface of the glass substrate of the anode (4) functioning as a touch sensing electrode of the organic EL panel (2) is touched by a finger (15). This operation generates finger capacitance (Cf) between the finger (15) and the anode (4A) (not shown) and achieves touch sensing.

Figure 21:
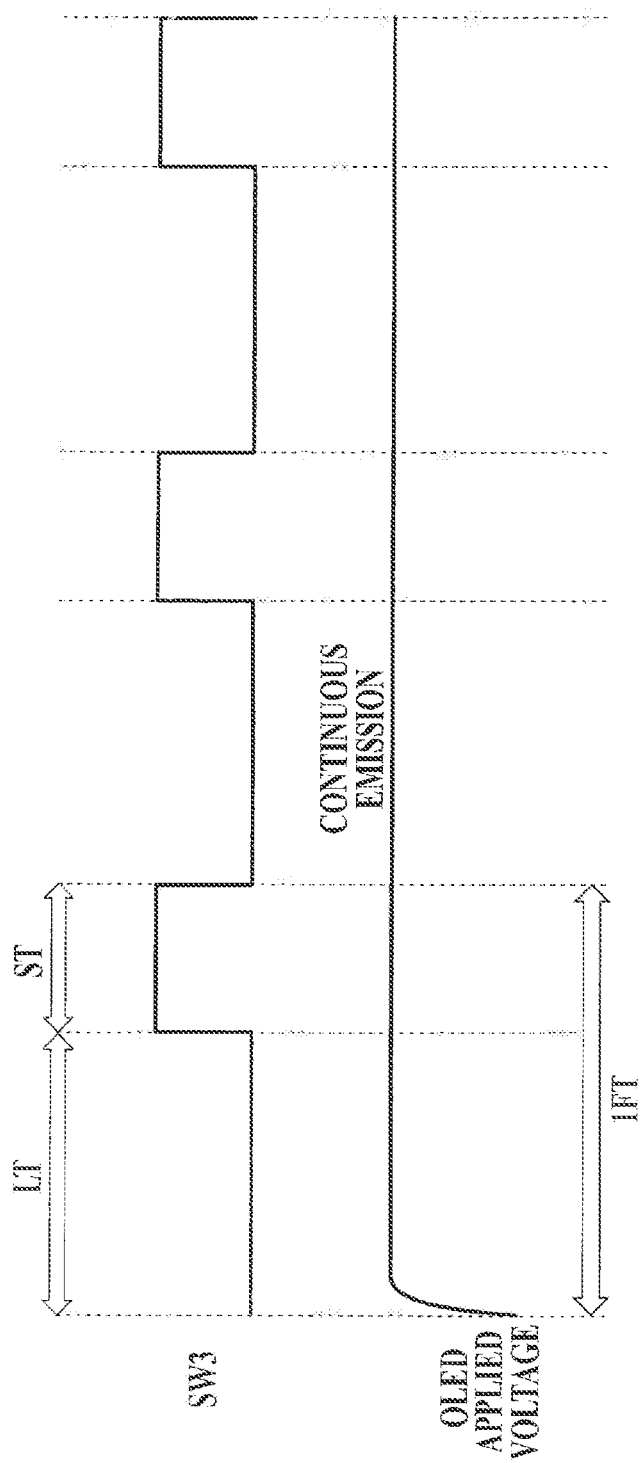
FIG. 21 is a timing chart illustrating a continuous emission term and an intermittent sensing term in Embodiment 4.

FIG. 21 is a timing chart illustrating a continuous emission term and an intermittent sensing term controlled by the turning-on/off of the third switch (SW3) in Embodiment 4. Unlike the timing chart illustrated in FIG. 5, the first and second switches (SW1 and SW2) are not provided, and the circuit is always closed. Thus, as illustrated in the lower chart, a voltage is always applied to the OLED, resulting in continuous emission of light. In contrast, the touch sensing is periodically performed by turning on/off the third switch (SW3) of the touch sensing circuit unit (14).

As illustrated in FIGS. 20 and 21, the turning-on/off control of the touch sensing circuit unit (14) is performed with the third switch (SW3). The third switch (SW3) may be replaced with the capacitor (30) as illustrated above in Embodiment 2.

(Another Exemplary Configuration of Organic EL Module: Touch Sensing Electrode=Cathode)

As illustrated in FIGS. 2 to 21, the anode functions as a touch sensing electrode. Alternatively, the cathode (6) may function as a touch sensing electrode.

FIG. 22 is a schematic cross-sectional view of another exemplary organic electroluminescent module of the present invention that includes a cathode functioning as a touch sensing electrode.

In contrast to the organic EL module of FIG. 2 including the anode (4A) functioning as a touch sensing electrode, the organic EL module of FIG. 22 includes a cathode (6A) functioning as a touch sensing electrode. The cathode (6A)

is connected to the touch sensing circuit unit (14), and the surface of the cathode (6A) is touched by a finger (15) for the touch sensing.

Embodiment 5

Figure 23:
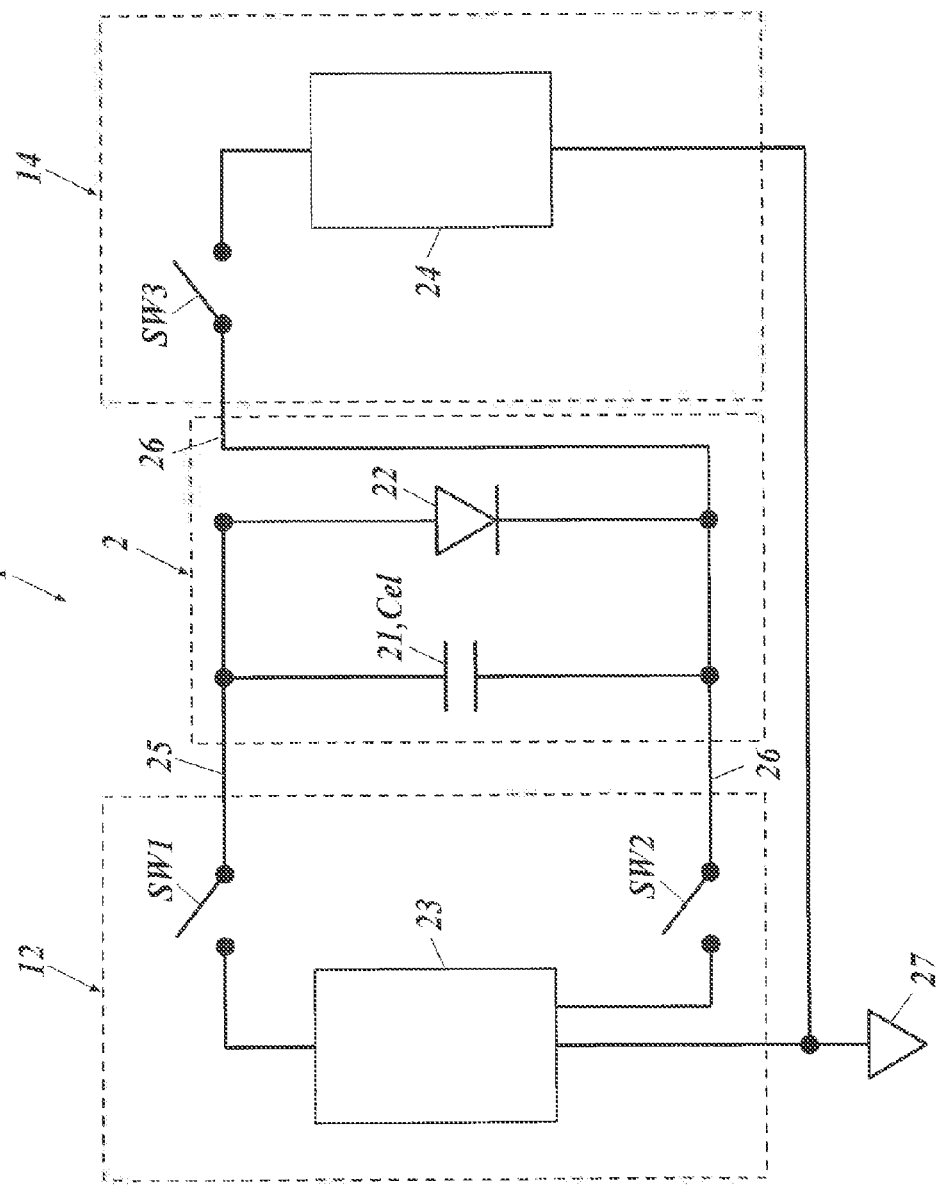
FIG. 23 is a driving circuit diagram of an organic electroluminescent module according to Embodiment 5 that includes a cathode functioning as a touch sensing electrode.

FIG. 23 is a driving circuit diagram of an organic electroluminescent module according to Embodiment 5 that includes a cathode (6A) (not shown) functioning as a touch sensing electrode. The organic electroluminescent module has the same driving circuit as that of Embodiment 1 illustrated in FIGS. 3 to 8, except that the cathode lead (26) is connected to the touch sensing circuit section (24) via the third switch (SW3).

Embodiment 6

Figure 24:
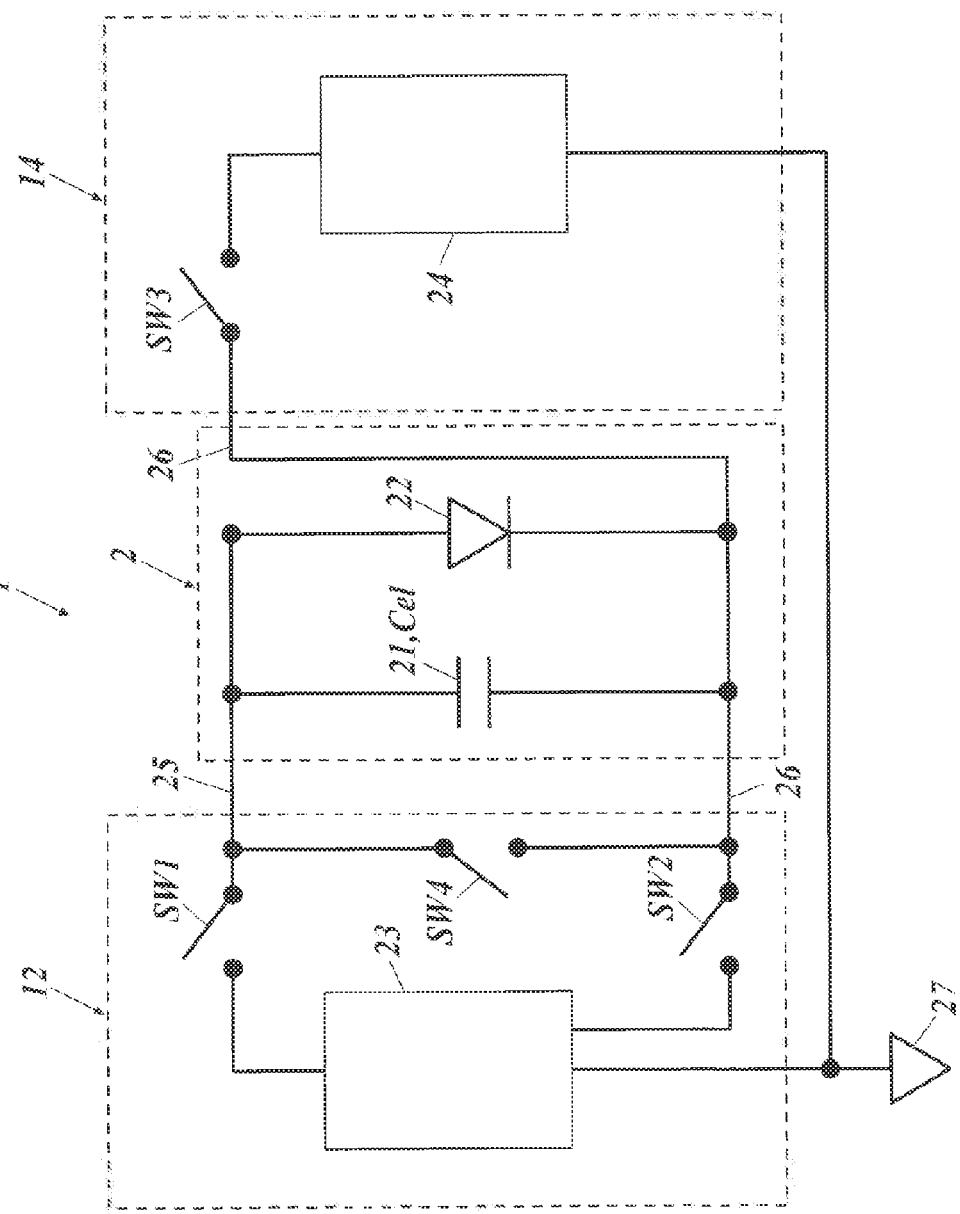
FIG. 24 is a driving circuit diagram of an organic electroluminescent module according to Embodiment 6 that includes a cathode functioning as a touch sensing electrode.

FIG. 24 is a driving circuit diagram of an organic electroluminescent module according to Embodiment 6 that includes a cathode functioning as a touch sensing electrode. The organic electroluminescent module has the same driving circuit as that of Embodiment 3 illustrated in FIGS. 15 to 19, except that the cathode lead (26) is connected to the touch sensing circuit section (24) via the third switch (SW3).

In the driving circuits according to Embodiments 5 and 6, the cathode (6A) functions as a touch sensing electrode. Also in the driving circuits described above in Embodiments 2 and 4, the cathode may be used as a touch sensing electrode in place of the anode.

<<Configuration of Organic Electroluminescent Panel>>

The organic EL panel (2) of the organic EL module (1), as shown in FIG. 2, includes a laminate functioning as an emission region of an anode (4A) and an organic functional layer unit (5) on a transparent substrate (3). A cathode (6) is disposed on the organic functional layer unit (5) to give an organic EL device. The periphery of the organic EL device is sealed with a sealing adhesive (7) and a sealing member (8) is disposed thereon.

Typical configurations of the organic EL device are listed below:
 (i) anode/(hole injection transport layer)/(luminous layer)/(electron injection transport layer)/cathode
 (ii) anode/(hole injection transport layer)/(luminous layer)/(hole blocking layer)/(electron injection transport layer)/cathode
 (iii) anode/(hole injection transport layer)/(electron blocking layer)/(luminous layer)/(hole blocking layer)/(electron injection transport layer)/cathode
 (iv) anode/(hole injection layer)/(hole transport layer)/(luminous layer)/(electron transport layer)/(electron injection layer)/cathode
 (v) anode/(hole injection layer)/(hole transport layer)/(luminous layer)/(hole blocking layer)/(electron transport layer)/(electron injection layer)/cathode
 (vi) anode/(hole injection layer)/(hole transport layer)/(electron blocking layer)/(luminous layer)/(hole blocking layer)/(electron transport layer)/(electron injection layer)/cathode If the luminous layer is composed of two or more luminous sublayers, two adjacent luminous sublayers may be separated by a nonluminous intermediate layer. The intermediate layer may be an electron generating layer or may have a multiphoton emission structure.

The detailed configurations of the organic EL devices applicable to the present invention are disclosed in, for example, Japanese Unexamined Patent Application Publication Nos. 2013-157634, 2013-168552, 2013-177361, 2013-187211, 2013-191644, 2013-191804, 2013-225678, 2013-235994, 2013-243234, 2013-243236, 2013-242366, 2013-243371, 2013-245179, 2014-003249, 2014-003299, 2014-013910, 2014-017493, and 2014-017494.

Individual layers of the organic EL device of the present invention will now be described in sequence.

(Transparent Substrate)

Examples of the transparent substrate (3) applicable to the organic EL device of the present invention include transparent materials, such as glass and plastics. Preferred transparent substrates (3) include glass, quartz, and resin films.

Examples of the glass materials include silica glass, soda lime silica glass, lead glass, borosilicate glass, and non-alkali glass. The surface of each glass material may be subjected to physical treatments such as polishing or may be covered with a thin organic or inorganic film or a thin hybrid film formed by combination of thin organic and inorganic films, in view of adhesiveness to the adjoining layer and durability and smoothness of the material.

Examples of the material for the resin film include polyesters, such as poly(ethylene terephthalate) (PET) and poly(ethylene naphthalate) (PEN); polyethylene; polypropylene; cellophane; cellulose esters and derivatives thereof, such as cellulose diacetate, cellulose triacetate (TAC), cellulose acetate butyrate, cellulose acetate propionate (CAP), cellulose acetate phthalate, and cellulose nitrate; poly(vinylidene chloride); poly(vinyl alcohol); poly(ethylene-vinyl alcohol); syndiotactic polystyrene; polycarbonates; norbornene resins; polymethylpentene; polyether ketones; polyimides, polyether sulfones (PESs); poly(phenylene sulfide); polysulfones; polyether imides; polyether ketone imides; polyamides; fluorinated resins; nylons; poly(methylmethacrylate); acrylics and polyarylates; and cycloolefin resins, such as Arton (commercial name, available from JSR) and Apel (commercial name, available from Mitsui Chemicals, Inc.).

The organic EL device may further include an optional gas barrier layer on the transparent substrate (3).

The gas barrier layer may be composed of any material that can block moisture and oxygen, which are components causing degradation of the organic EL device. Examples of such materials include inorganic compounds, such as silicon monoxide, silicon dioxide, and silicon nitride. The gas barrier layer should preferably have a layered structure composed of one or more inorganic layers and organic layers to solve the fragility of the gas barrier layer. The inorganic layers and organic layers may be laminated in any order and may be alternately laminated in a preferred embodiment.

(Anode)

Examples of materials for the anode of the organic EL device include metals, such as Ag and Au; alloys primarily composed of such metals; CuI; indium-tin oxide (ITO); and metal oxides, such as $SnO_2$ and ZnO. Preferred are the aforementioned metals and alloys primarily composed of the metals. More preferred are silver and silver-based alloys. In the case where light is emitted from the anode, the anode should be transparent.

In the case of a transparent anode primarily composed of silver, the anode layer may be composed of silver alone or a silver (Ag) alloy to enhance the stability of silver. Examples of such alloys include silver-magnesium (Ag—Mg), silver-copper (Ag—Cu), silver palladium (Ag—Pd), silver-palladium-copper (Ag—Pd—Cu), silver-indium (Ag—In), and silver-gold (Ag—Au) alloys.

Preferably the anode of the organic EL device of the present invention should be a transparent anode composed primarily of silver and having a thickness of 2 to 20 nm, more preferably 4 to 12 nm. A thickness of less than 20 nm of the transparent anode reduces absorption and reflection of light and thus achieves high light transmittance.

In the present invention, the term "a layer primarily composed of silver" indicates that the transparent anode contains silver in an amount of 60 mass % or more, preferably 80 mass % or more, more preferably 90 mass % or more, most preferably 98 mass % or more. The term "transparent" on the anode in the present invention refers to a light transmittance of 50% or more at a wavelength of 550 nm.

The transparent anode may be composed of two or more silver-based layers according to demand.

In the present invention, a silver-based transparent anode may be underlain by a foundation layer to enhance the uniformity of the transparent silver anode. The foundation layer may be composed of any material, preferably an organic compound containing a nitrogen or sulfur atom. Preferably a transparent anode is formed on the foundation layer.

(Intermediate Electrode)

The organic EL device of the present invention may include two or more organic functional layer units each consisting of an organic functional layer group and a luminous layer and disposed between an anode and a cathode. Two adjacent organic functional layer units are separated by an intermediate electrode layer having a connection terminal for electrical connection.

(Luminous Layer)

The luminous layer of the organic EL device should preferably contain a luminous material, such as a phosphorescent or fluorescent material.

In the luminous layer, electrons injected from an electrode or electron transport layer and holes injected from a hole transport layer recombine to emit light. Light may be emitted in the luminous layer or at an interface between the luminous layer and the adjoining layer.

The luminous layer may be composed of any luminous material satisfying luminescent requirements. The luminous layer may be composed of two or more sublayers having the same emission spectrum and maximum emission wavelength. In this case, a non-luminescent intermediate layer should be preferably disposed between two adjacent luminous sublayers.

The total thickness of the luminous layer should preferably ranges from 1 to 100 nm, more preferably 1 to 30 nm to reduce the driving voltage. The total thickness includes the thickness(es) of the optional non-luminescent intermediate layer(s) disposed between the luminous sublayers.

The luminous layer can be formed with luminous materials and host compounds, which will be described below, by any known process, such as vacuum evaporation, spin coating, casting, Langmuir-Blodgett coating, or ink jetting.

The luminous layer may be composed of two or more luminous materials, for example, a mixture of a phosphorescent material and a fluorescent material (also referred to as a fluorescent dopant or fluorescent compound). In a preferred embodiment, the luminous layer contains a host compound (also referred to as a luminescent host) and a luminous material (also referred to as a luminescent dopant) so that the luminous material emits light.

<Host Compound>

Preferred host compounds to be compounded in the luminous layer have a phosphorescence quantum yield of less than 0.1 at room temperature (25° C.), more preferably less than 0.01. The volume fraction of the host compound is preferably 50% or more in the luminous layer.

Any known host compound may be used. The host compounds may be used alone or in combination. Use of two or more host compounds facilitates the adjustment of charge transfer and thus enhances the efficiency of the organic electroluminescent device. Use of two or more luminous materials that emit different colors facilitates emission of light with a desired color.

The host compounds used in the luminous layer may be any known low-molecular-weight compound, any polymer having repeating units, or any low-molecular weight compound having a polymerizable group, for example, a vinyl or epoxy group (evaporation-polymerizable luminescent host).

The host compounds usable in the present invention are disclosed in, for example, Japanese Unexamined Patent Application Publication Nos. 2001-257076, 2001-357977, 2002-8860, 2002-43056, 2002-105445, 2002-352957, 2002-231453, 2002-234888, 2002-260861, and 2002-305083; United States Patent Application Nos. 2005/0112407 and 2009/0030202; WO2001/039234, WO2008/056746, WO2005/089025, WO2007/063754, WO2005/030900, WO2009/086028, and WO2012/023947; Japanese Unexamined Patent Application Publication No. 2007-254297; and EP2034538.

<Luminous Material>

Examples of the luminous material usable in the present invention include phosphorescent compounds (also referred to as phosphorescent materials or phosphorescent dopants) and fluorescent compounds (also referred to as fluorescent materials).

<Phosphorescent Compound>

Phosphorescent compounds involve light emission from the excited triplet state, emit phosphorescent light at room temperature (25° C.), and have a phosphorescent quantum yield of 0.01 or more at 25° C. The phosphorescent quantum yield is preferably 0.1 or more.

The phosphorescent quantum yield can be determined by the method described in the Fourth Series of Experimental Chemistry, Vol. 7 Spectroscopy II, page 398 (1992, published by Maruzen). The phosphorescent quantum yield can be determined with any solvent, and phosphorescent compounds having a phosphorescent quantum yield of 0.01 or more determined with any solvent can be used in the present invention.

Any known phosphorescent compounds used in the luminous layers of common organic EL devices can be appropriately used in the present invention. Preferred are complexes containing metal atoms belonging to groups 8 to 10 in the periodic table, more preferred are iridium, osmium, and platinum complexes (collectively referred to as platinum-based complexes) or rare earth complexes, and most preferred are iridium complexes.

In the present invention, one luminous layer may contain two or more phosphorescent compounds. The proportion of these phosphorescent compounds may vary along the thickness of the luminous layer.

Examples of the phosphorescent compounds usable in the present invention are listed in the following documents:

Nature 395,151 (1998), Appl. Phys. Lett. 78, 1622(2001), Adv. Mater. 19, 739(2007), Chem. Mater. 17, 3532(2005), Adv. Mater. 17, 1059(2005), WO2009/100991, WO2008/101842, WO2003/040257, and United States Patent Application Nos. 2006/835469, 2006/0202194, 2007/0087321, and 2005/0244673.

Further examples include Inorg. Chem. 40, 1704(2001), Chem. Mater. 16, 2480(2004), Adv. Mater. 16, 2003(2004), Angew. Chem. Int. Ed. 2006, 45, 7800, Appl. Phys. Lett. 86, 153505(2005), Chem. Lett. 34, 592(2005), Chem. Commun.

2906 (2005), Inorg. Chem. 42, 1248(2003), WO2009/050290, WO2009/000673, U.S. Pat. No. 7,332,232, United States Patent Application No. 2009/0039776, U.S. Pat. No. 6,687,266, United States Patent Application Nos. 2006/0008670 and 2008/0015355, U.S. Pat. No. 7,396,598, United States Patent Application No. 2003/0138657, and U.S. Pat. No. 7,090,928.

Further examples include Angew. Chem. Int. Ed. 47,1 (2008), Chem. Mater. 18, 5119(2006), Inorg. Chem. 46, 4308(2007), Organometallics 23, 3745(2004), Appl. Phys. Lett. 74, 1361(1999), WO2006/056418, WO2005/123873, WO2005/123873, WO2006/082742, United States Patent Application No. 2005/0260441, U.S. Pat. No. 7,534,505, United States Patent Application No. 2007/0190359, U.S. Pat. No. 7,338,722, U.S. Pat. No. 7,279,704, and United States Patent Application No. 2006/103874.

Further examples include WO2005/076380, WO2008/140115, WO2011/134013, WO2010/086089, WO2012/020327, WO2011/051404, WO2011/073149, and Japanese Unexamined Patent Application Publication Nos. 2009-114086, 2003-81988, and 2002-363552.

Preferred phosphorescent compounds in the present invention are organometallic complexes containing iridium (Ir) as a central atom. More preferred are complexes having at least one coordinate bond selected from a metal-carbon bond, a metal-nitrogen bond, a metal-oxygen bond, and a metal-sulfur bond.

Such phosphorescent compounds or phosphorescent metal complexes can be prepared by the processes described, for example, in the following documents and references cited in these documents: Organic Letter, vol. 3, No. 16, pp. 2579-2581 (2001), Inorganic Chemistry, vol. 30, No. 8, pp. 1685-1687 (1991), J. Am. Chem. Soc., vol. 123, p. 4304 (2001), Inorganic Chemistry, vol. 40, No. 7, pp. 1704-1711 (2001), Inorganic Chemistry, vol. 41, No. 12, pp. 3055-3066 (2002), New Journal of Chemistry., vol. 26, P. 1171 (2002), and European Journal of Organic Chemistry, vol. 4, pp. 695-709 (2004).

<Fluorescent Compound>

Examples of the fluorescent compound include coumarin dyes, pyran dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, and rare earth complex phosphors.

(Organic Functional Layer Group)

The charge injection layer, the hole transport layer, the electron transport layer, and a barrier layer of the organic functional layer unit other than the luminous layer will now be described in sequence.

(Charge Injection Layer)

The charge injection layer is provided between the electrode and the luminous layer to decrease the driving voltage and to increase the luminance. The detail of the charge injection layer is described in "Yuuki EL Debaisu to sono Kogyoka Saizensen (Front Line in Industrialization of Organic EL Device)", Part II, Chapter 2, pp. 123-166, "Denkyoku Zairyo (Electrode materials)" (Nov. 30, 1998 by N. T. S. Company). The charge injection layers are classified into hole injection layers and electron injection layers.

With the charge injection layer, the hole injection layer is usually disposed between the anode and the luminous layer or hole transport layer, while the electron injection layer is usually disposed between the cathode and the luminous layer or electron transport layer. The present invention is characterized in that the charge injection layer is disposed adjacent to the transparent electrode. In the case where the charge injection layer is used as an intermediate electrode, at least one of the electron injection layer and the adjacent hole injection layer satisfies the requirement of the present invention.

The hole injection layer is provided adjacent to the transparent anode to decrease the driving voltage and to increase the luminance. The detail of this layer is described in "Yuuki EL Debaisu to sono Kogyoka Saizensen (Front Line in Industrialization of Organic EL Device)", Part II, Chapter 2, pp. 123-166, "Denkyoku Zairyo (Electrode materials)" (Nov. 30, 1998 by N. T. S. Company).

The hole injection layer is described in detail, for example, in Japanese Unexamined Patent Application Publication Nos. Hei9-45479, Hei9-260062, and Hei8-288069. Examples of materials for the hole injection layer include porphyrin derivatives, phthalocyanine derivatives, oxazole derivatives, oxaziazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indrocarbazole derivatives, isoindole derivatives, acene derivatives e.g., anthracene and naphthalene, fluorene derivatives, fluorenone derivatives, polyvinylcarbazole, polymers and oligomers having arylamine main or side chains, polysilanes, and conductive polymers and oligomers, e.g., poly(ethylene dioxythiophene) (PEDOT), poly(styrene sulfonate) (PSS), aniline copolymers, polyaniline, and polythiophene.

Examples of the triarylamine derivatives include benzidine types such as (4,4'-bis(N-(1-naphthyl)-N-phenylamino)biphenyl) (α-NPD), star-burst types, such as MTDATA (4,4',4''-tris(N-(3-methylphenyl)-N-phenylamino)triphenylamine), and compounds having fluorene and anthracene in the triarylamine coupling cores.

Alternatively, the hole transport material may be hexaazatriphenylene derivatives described in Japanese translation of PCT application 2003-519432 and Japanese Unexamined Patent Application Publication No. 2006-135145.

The electron injection layer is provided between the cathode and the luminous layer to decrease the driving voltage and to increase the luminance. The detail of the electron injection layer is described in "Yuuki EL Debaisu to sono Kogyoka Saizensen (Front Line in Industrialization of Organic EL Device)", Part II, Chapter 2, pp. 123-166, "Denkyoku Zairyo (Electrode materials)" (Nov. 30, 1998 by N. T. S. Company).

The electron injection layer is described in detail, for example, in Japanese Unexamined Patent Application Publication Nos. Hei6-325871, Hei9-17574, and Hei10-74586. Examples of preferred materials for electron injection layer include metals, such as strontium and aluminum; alkali metal compounds, such as lithium fluoride, sodium fluoride, and potassium fluoride; alkali metal halides, such as magnesium fluoride and calcium fluoride; alkaline earth metal compounds, such as magnesium fluoride; metal oxides, such as molybdenum oxide and aluminum oxide; and metal complexes, such as lithium-8-hydroxyquinolate (Liq). In combination with a transparent cathode in the present invention, organic compounds such as metal complexes are particularly preferred. Preferably, the electron injection layer should have a significantly small thickness within the range of 1 nm to 10 μm, although it depends on the materials constituting the layer.

(Hole Transport Layer)

The hole transport layer is composed of a hole transport material that can transport holes. The hole injection layer and electron blocking layer also function as a hole transport layer in a broad sense. The device may include a single hole transport layer or two or more hole transport layers.

The hole transport layer may be composed of any organic or inorganic compound which can inject or transport holes or can block electrons. Examples of such materials include triazole derivatives, oxadiazole derivatives, imidazole derivatives, polyarylalkane derivatives, pyrazoline derivatives, pyrazolone derivatives, phenyldiamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers, conductive polymers and oligomers, and thiophene oligomers.

The hole transport material may be porphyrin compounds, tertiary arylamine compounds, and styrylamine compounds, besides the compounds described above. Preferred are tertiary arylamine compounds.

Typical examples of the tertiary arylamine compound and styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (TPD), 2,2-bis(4-di-p-tolylaminophenyl) propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminopnenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quodriphenyl, N,N,N-tri(p-tolyl)amine, 4-(di-p-tolylamino)-4'-(4-(di-p-tolylamino)styryl)stilbene, 4-N,N-diphenylamino-(2-diphenylvinyl)benzene, 3-methoxy-4'-N,N-diphenylaminostyrylbenzene, and N-phenylcarbazole.

A thin film of the hole transport layer can be formed with the hole transport material by any known process, for example, vacuum evaporation, spin coating, casting, printing such as ink jetting, or Langmuir Blodgett (LB) deposition. The hole transport layer may have any thickness, usually a thickness of about 5 nm to 5 µm, preferably 5 to 200 nm. The hole transport layer may have a single layer configuration composed of one or more of the materials described above.

The hole transport layer may be doped with any dopant to enhance p characteristics. Such techniques are described, for example, in Japanese Unexamined Patent Application Publication Nos. Hei4-297076, 2000-196140, and 2001-102175, and J. Appl. Phys., 95, 5773(2004).

A hole transport layer with enhanced p characteristics advantageously contributes to production of devices with low power consumption.

(Electron Transport Layer)

The electron transport layer is composed of a material that can transport electrons. An electron injection layer and a hole blocking layer correspond to electron transport layers in broad sense. The electron transport layer may have a monolayer or multilayer configuration.

In an electron transport layer having a monolayer or multilayer configuration, the electron transport material (also functioning as hole blocking material) constituting a layer adjacent to the luminous layer can transport electrons injected from the cathode to the luminous layer. Any known material can be used. Examples of such materials include nitro-substituted fluorene derivatives, diphenylquinone derivatives, thiopyrane dioxide derivatives, carbodiimides, fluorenylidene methane derivatives, anthraquinodimethane, anthrone derivatives, and oxadiazole derivatives. In addition, thiazazole derivatives in which the oxygen atom in the oxadiazole ring is replaced with a sulfur atom in the oxadiazole derivatives, and quinoxaline derivatives having quinoxaline rings being electron attractive groups can also be used as materials for the electron transport layer. Polymer materials containing these materials as polymer chains or main chains can also be used.

Furthermore, materials for the electron transport layer may be metal complexes of 8-quinolinol derivatives, such as tris (8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-metal-8-quinolinol)aluminum, and bis(8-quinolinol) zinc (Znq); and metal complexes of which the central metals are replaced with In, Mg, Cu, Ca, Sn, Ga, or Pb.

A thin film of the electron transport layer can be formed with the electron transport material by any known process, for example, vacuum evaporation, spin coating, casting, printing such as ink jetting, or Langmuir Blodgett (LB) deposition. The electron transport layer may have any thickness, usually a thickness of about 5 nm to 5 µm, preferably 5 to 200 nm. The electron transport layer may have a single layer configuration composed of one or more of the materials described above.

(Blocking Layer)

The blocking layers are classified into hole blocking layers and electron blocking layers. These layers may be provided as needed in addition to the individual layers in the organic functional layer unit 3 described above. Examples of the blocking layer are disclosed in Japanese Unexamined Patent Application Publication Nos. Hei11-204258 and Hei11-204359, and hole blocking layers described in "Yuuki EL Debaisu to sono Kogyoka Saizensen (Front Line in Industrialization of Organic EL Device)", p. 237, (Nov. 30, 1998 by N. T. S. Company).

The hole blocking layer also functions as an electron transport layer in a broad sense. The hole blocking layer is composed of a hole blocking material that can transport electrons but barely transport holes. Since the hole blocking layer transports electrons while blocking holes, the layer can enhance the opportunity of recombination of electrons and holes. The configuration of the electron transport layer can be used as a hole blocking layer. Preferably, the hole blocking layer is disposed adjacent to the luminous layer.

The electron blocking layer also functions as a hole transport layer in a broad sense. The electron blocking layer is composed of an electron blocking material that can transport holes but barely transport electrons. Since the electron blocking layer transport holes while blocking electrons, the layer can enhance the opportunity of recombination of electrons and holes. The configuration of the hole transport layer can be used as an electron blocking layer. The hole blocking layer in the present invention has a thickness in the range of preferably 3 to 100 nm, more preferably 5 to 30 nm.

(Cathode)

The cathode feeds holes to the organic functional layer group and the luminous layer and is composed of a metal, alloy, organic or inorganic conductive compound, or a mixture thereof. Specific examples include gold, aluminum, silver, magnesium, lithium, magnesium/copper mixtures, magnesium/silver mixtures, magnesium/aluminum mixtures, magnesium/indium mixtures, indium, lithium/aluminum mixture, rare earth metals, and oxide semiconductors, such as ITO, ZnO, $TiO_2$, and $SnO_2$.

A thin film of the cathode can be prepared with these conductive materials by evaporation or sputtering. The cathode as a second electrode has a sheet resistance of preferably several hundred Ω/sheet or less, and a thickness of in the range of generally 5 nm to 5 µm, preferably 5 to 200 nm.

For an organic EL device that emits light from the cathode or that is of a double sided emission type, a cathode having high light transmissivity is selected.

(Sealing Member)

The organic EL device can be sealed, for example, by adhesion of a sealing member with the cathode and transparent substrate with an adhesive.

The sealing member is disposed so as to cover the display region of the organic EL device, and may have a concave or flat shape. The sealing member may have any transparency and electrical insulation.

Examples of the sealing member include glass plates, polymer plates, films, metal plates, and films. Examples of glass of the glass plate include soda lime glass, barium and strontium containing glass, lead glass, aluminosilicate glass, borosilicate glass, barium borosilicate glass, and quartz. Examples of materials for the polymer plate include polycarbonates, acrylic resins, poly(ethylene terephthalate), poly (ether sulfides), and polysulfones. Examples of metals of the metal plate include stainless steel, iron, copper, aluminum, magnesium, nickel, zinc, chromium, titanium, molybdenum, silicon, germanium, tantalum, and alloys thereof.

Preferred sealing members are composed of polymer or metal films that can reduce the thickness of the organic EL device. Preferably, the polymer film should have a moisture permeability of $1\times10^{-3}$ g/m$^2\cdot$24 h or less at a temperature of 25±0.5° C. and a relative humidity of 90±2% RH in accordance with JIS K 7129-1992 and more preferably an oxygen permeability of $1\times10^{-3}$ ml/m$^2\cdot$24 h·atm (where 1 atm is $1.01325\times10^5$ Pa) or less in accordance with JIS K 7126-1987 and a moisture permeability of $1\times10^{-3}$ g/m$^2\cdot$24 h or less at a temperature of 25±0.5° C. and a relative humidity of 90±2% RH.

The gap between the sealing member and the display region (emission region) of the organic EL device should preferably be filled with inert gas, for example, nitrogen, argon, or fluorohydrocarbon, or inert liquid, for example, silicone oil. Alternatively, the gap between the sealing member and the display region of the organic EL device may be vacuum or may be filled with a hygroscopic compound.

(Production of Organic EL Device)

The organic EL device is produced by depositing an anode, an organic functional layer group 1, a luminous layer, another organic functional layer group 2, and a cathode on a transparent substrate.

A transparent substrate is prepared. A thin film of a desired electrode material, for example, an anode material is deposited onto the transparent substrate into a thickness of 1 µm or less, preferably in the range of 10 to 200 nm by evaporation or sputtering, for example, to form an anode. A connection terminal to be connected to an external power source (for example, an anode lead extending from the anode described in FIG. 3) is formed.

A hole injection layer and a hole transport layer of an organic functional layer group 1, a luminous layer, and an electron transport layer of another organic functional layer group 2 are then deposited in sequence.

These layers may be formed by spin coating, casting, ink jetting, evaporation, or printing. Particularly preferred are vacuum evaporation and spin coating, which can form uniform layers without pinholes. Individual layers may be formed by different processes. In the case of evaporation, each layer is preferably formed under the following evaporation conditions: a boat heating temperature in the range of 50 to 450° C., a degree of vacuum of $1\times10^{-6}$ to $1\times10^{-2}$ Pa, an evaporation rate of 0.01 to 50 nm/sec, and a substrate temperature of −50 to 300° C., and a thickness of 0.1 to 5 µm, although these conditions vary depending on the type of the compound used A cathode is formed by patterning on the organic functional layer group 2 by an appropriate process, such as evaporation or sputtering such that the cathode is insulated from the anode by the organic functional layer group and extends from above the organic functional layer group to the periphery of the transparent substrate.

After the formation of the cathode, the transparent substrate, anode, organic functional layer groups, luminous layer, and cathode are sealed with a sealing member. In detail, the terminals of the anode and cathode (leads of these electrodes) are exposed, and the sealing member covers at least the organic functional layer group on the transparent substrate.

In the production of the organic EL panel, for example, each electrode of the organic EL device is electrically connected to a light-emitting device driving circuit unit (12) or a touch sensing circuit unit (14). Any conductive material may be used for electrical connection (extending lead), and preferred are anisotropic conductive films (ACFs), conductive paste, or metal paste.

For example, the anisotropic conductive film (ACF) may be a layer containing fine conductive particles dispersed in thermally curable resin. In the present invention, the layer may contain any fine conductive particles having electrical anisotropy, which can be appropriately selected for any purpose. Examples of the conductive particles usable in anisotropic conductive materials include metal particles and metallized resin particles. Commercially available ACFs are, for example, low-temperature-curable ACFs applicable to a resin film, such as MF-331 (available from Hitachi Chemical Co. Ltd.).

Examples of metal for metal particles include nickel, cobalt, silver, copper, gold, and palladium. Examples of metallized resin particles include resin cores covered with nickel, copper, gold, or palladium. Examples of the metal paste include commercially available metal nanoparticle pastes.

<<Field of Application of Organic EL Module>>

The organic electroluminescent module of the present invention contributes to reduction in sizes and thickness of the device, and can be produced through simplified production steps. The organic electroluminescent module is favorably used for various types of smart devices, such as smart phones and tablets, and illumination devices.

(Smart Device)

FIG. 25 is an outline view of an example smart device (100) provided with the organic EL module of the present invention at the icon region.

The smart device 100 of the present invention includes an organic electroluminescent module (MD) having a touch sensing function, which is illustrated in FIGS. 3 to 24, and a liquid crystal display 120. The liquid crystal display 120 may be of a known type.

FIG. 25 illustrates an illuminated state of the organic electroluminescent module (MD) of the present invention. Several displayed patterns (111) are visible from an anterior view. In the non-illuminated state of the organic electroluminescent module (MD), these patterns (111) are invisible. The displayed patterns (111) in FIG. 25 are mere examples, and any other drawing, character, and design are also usable as patterns. The "displayed pattern" refers to a design, character, or image that is displayed by light emitted from the organic EL device.

(Illumination Device)

The organic electroluminescent module of the present invention can also be applied to illumination devices. Examples of illumination devices provided with the organic electroluminescent module of the present invention include domestic lighting, vehicle lighting, backlights of liquid crystal displays, and displays. Further examples include backlight of watches; billboard advertisements; traffic signals; light sources of optical memory media, electrophotographic copying machines, optical communication devices, and photosensors; and domestic electric devices provided with displays.

INDUSTRIAL APPLICABILITY

The organic electroluminescent module of the present invention contributes to reduction in sizes and thickness of the device, and can be produced through simplified production steps. The organic electroluminescent module is favorably used for various types of smart devices, such as smart phones and tablets, and illumination devices.

REFERENCE SIGNS LIST

1, MD organic EL module
2 organic EL panel
3 transparent substrate
4 anode
4A anode functioning as touch sensing electrode
5 organic functional layer unit
6 cathode
6A cathode functioning as a touch sensing electrode
7 sealing adhesive
8 sealing member
9 touch sensing unit
10 traditional touch sensing electrode
11 cover glass
12 light-emitting device driving circuit unit
13 separable touch sensing circuit unit
14 touch sensing circuit unit
15 finger
16 ground
21 capacitor (Cel)
22 organic EL device
23 light emitting device driving circuit section
24 touch sensing circuit section
25 anode lead
26 cathode lead
27 ground
28 emission controlling information route
29 touch sensing information route
30 capacitor (Cs)
100 smart device
111 display pattern
120 liquid crystal display
1FT one frame term
Cf capacitance at finger touch
LT emission term
ST sensing term
SW1 first switch
SW2 second switch
SW3 third switch
SW4 fourth switch
t1 waiting term
τ OLED charge/discharge time constant

The invention claimed is:

1. An organic electroluminescent module having a touch sensing function, the organic electroluminescent module comprising:
   a capacitive touch sensing circuit unit; and
   a light-emitting device driving circuit unit including a light-emitting device driving circuit section for driving an organic electroluminescent panel, wherein
   the organic electroluminescent panel comprises paired opposite plate electrodes therein,
   the paired electrodes are connected to the light-emitting device driving circuit unit, and
   one of the paired electrodes is a touch sensing electrode, the touch sensing electrode being connected to the touch sensing circuit unit.

2. The organic electroluminescent module according to claim 1, wherein the touch sensing circuit unit and the light-emitting device driving circuit unit are connected to a common ground.

3. The organic electroluminescent module according to claim 1, wherein
   an emission term of the organic electroluminescent panel controlled by the light-emitting device driving circuit section is separated from a touch sensing term of the organic electroluminescent panel controlled by a touch sensing circuit section, and
   at least one of the paired electrodes is in a floating potential during the touch sensing term to prevent detection of the capacitance of the organic electroluminescent panel.

4. The organic electroluminescent module according to claim 1, wherein
   an emission term of the organic electroluminescent panel controlled by the light-emitting device driving circuit section is separated from a touch sensing term of the organic electroluminescent panel controlled by a touch sensing circuit section, and
   both of the paired electrodes are in a floating potential during the touch sensing term to prevent detection of the capacitance of the organic electroluminescent panel.

5. The organic electroluminescent module according to claim 1, wherein
   an emission term of the organic electroluminescent panel controlled by the light-emitting device driving circuit section is separated from a touch sensing term of the organic electroluminescent panel controlled by a touch sensing circuit section, and
   at least one of the paired electrodes is in a floating potential and the paired electrodes are short-circuited during the touch sensing term to prevent detection of the capacitance of the organic electroluminescent panel.

6. The organic electroluminescent module according to claim 1, wherein
   an emission term of the organic electroluminescent panel controlled by the light-emitting device driving circuit section is separated from a touch sensing term of the organic electroluminescent panel controlled by a touch sensing circuit section, and
   both of the paired electrodes are in a floating potential during the touch sensing term and the paired electrodes are short-circuited to prevent detection of the capacitance of the organic electroluminescent panel.

7. The organic electroluminescent module according to claim 1, wherein,
   the organic electroluminescent panel controlled by the light-emitting device driving circuit section is driven to continuously emit light, and a touch sensing term of the organic electroluminescent panel periodically occurs under control of a touch sensing circuit section.

8. The organic electroluminescent module according to claim 1, wherein an emission term of the organic electroluminescent panel controlled by the light-emitting device driving circuit section includes a reverse-voltage applying time at the end of the emission term.

9. The organic electroluminescent module according to claim 1, further comprising a capacitor disposed between a lead connecting the light-emitting device driving circuit section with a ground and a lead connecting a touch sensing circuit section with the ground.

10. A smart device comprising an organic electroluminescent module according to claim 1.

11. An illumination device comprising an organic electroluminescent module according to claim 1.

* * * * *